(12) United States Patent
Jyumonji et al.

(10) Patent No.: US 7,186,602 B2
(45) Date of Patent: Mar. 6, 2007

(54) LASER ANNEALING METHOD

(75) Inventors: Masayuki Jyumonji, Yokohama (JP);
Masakiyo Matsumura, Yokohama (JP);
Yoshinobu Kimura, Yokohama (JP);
Mikihiko Nishitani, Yokohama (JP);
Masato Hiramatsu, Yokohama (JP);
Yukio Taniguchi, Yokohama (JP);
Fumiki Nakano, Yokohama (JP);
Hiroyuki Ogawa, Yokohama (JP)

(73) Assignee: Advanced LCD Technologies Development Center Co. Ltd., Yokohama (JP)

( * ) Notice: Subject to any disclaimer, the term of this patent is extended or adjusted under 35 U.S.C. 154(b) by 163 days.

(21) Appl. No.: 11/041,413

(22) Filed: Jan. 25, 2005

(65) Prior Publication Data

US 2005/0145845 A1    Jul. 7, 2005

Related U.S. Application Data

(63) Continuation of application No. 10/668,285, filed on Sep. 24, 2003, now Pat. No. 6,870,126.

(30) Foreign Application Priority Data

Sep. 25, 2002  (JP)  ............................. 2002-279608
Apr. 15, 2003  (JP)  ............................. 2003-110861

(51) Int. Cl.
*H01L 21/84*  (2006.01)
*H01L 21/324* (2006.01)

(52) U.S. Cl. .................... 438/166; 438/149; 438/157
(58) Field of Classification Search ................ 438/149, 438/157, 166
See application file for complete search history.

(56) References Cited

U.S. PATENT DOCUMENTS

| | | | |
|---|---|---|---|
| 6,210,996 B1 | 4/2001 | Yamazaki et al. | |
| 6,252,714 B1 | 6/2001 | Guenther et al. | |
| 6,341,042 B1* | 1/2002 | Matsunaka et al. | 359/618 |
| 6,524,977 B1 | 2/2003 | Yamazaki et al. | |
| 6,632,711 B2* | 10/2003 | Sugano et al. | 438/166 |
| 2003/0017658 A1* | 1/2003 | Nishitani et al. | 438/166 |
| 2003/0036251 A1* | 2/2003 | Mitsuhashi et al. | 438/487 |

FOREIGN PATENT DOCUMENTS

| | | |
|---|---|---|
| JP | 2002-151407 | 5/2002 |
| JP | 2002-280309 | 9/2002 |
| JP | 2002-313725 | 10/2002 |
| JP | 2002-313726 | 10/2002 |

OTHER PUBLICATIONS

"Flat Panel Display", 1999, Nikkei Micro Device, Supplemental Edition, Nikkei BP Co., Ltd., 1998, pp. 132-139.

(Continued)

*Primary Examiner*—Geoffrey S. Evans
(74) *Attorney, Agent, or Firm*—Oblon, Spivak, McClelland, Maier & Neustadt, P.C.

(57) ABSTRACT

The semiconductor device according to the present invention has a semiconductor layer having not smaller than two types of crystal grains different in size within a semiconductor circuit on a same substrate.

12 Claims, 17 Drawing Sheets

OTHER PUBLICATIONS

M. Jyumonji, et al., "High-Resolution Beam Profiler—New Powerful Tool for Engineering Laterally-Grown Grain Morphology-", AMDp-17 (Late-News Paper), IDW '02, pp. 1387-1388.

Ryoichi Ishihara, et al., "Effects of Light Pulse Duration on Excimer-Laser Crystallization Characteristics of Silicon Thin Films", Jpn. J. Appl. Phys. vol. 34, Part 1, No. 4A, Apr. 1995, pp. 1759-1764.

Masayuki Jyumonji, et al., "Double Pulse Method for Enlarging Lateral Grain Growth of Excimer Laser Annealed Poly-Si Thin Films", The Institute of Physical and Chemical Research, NEC Res. & Develop., vol. 42, No. 3, Jul. 2001, pp. 272-276.

* cited by examiner

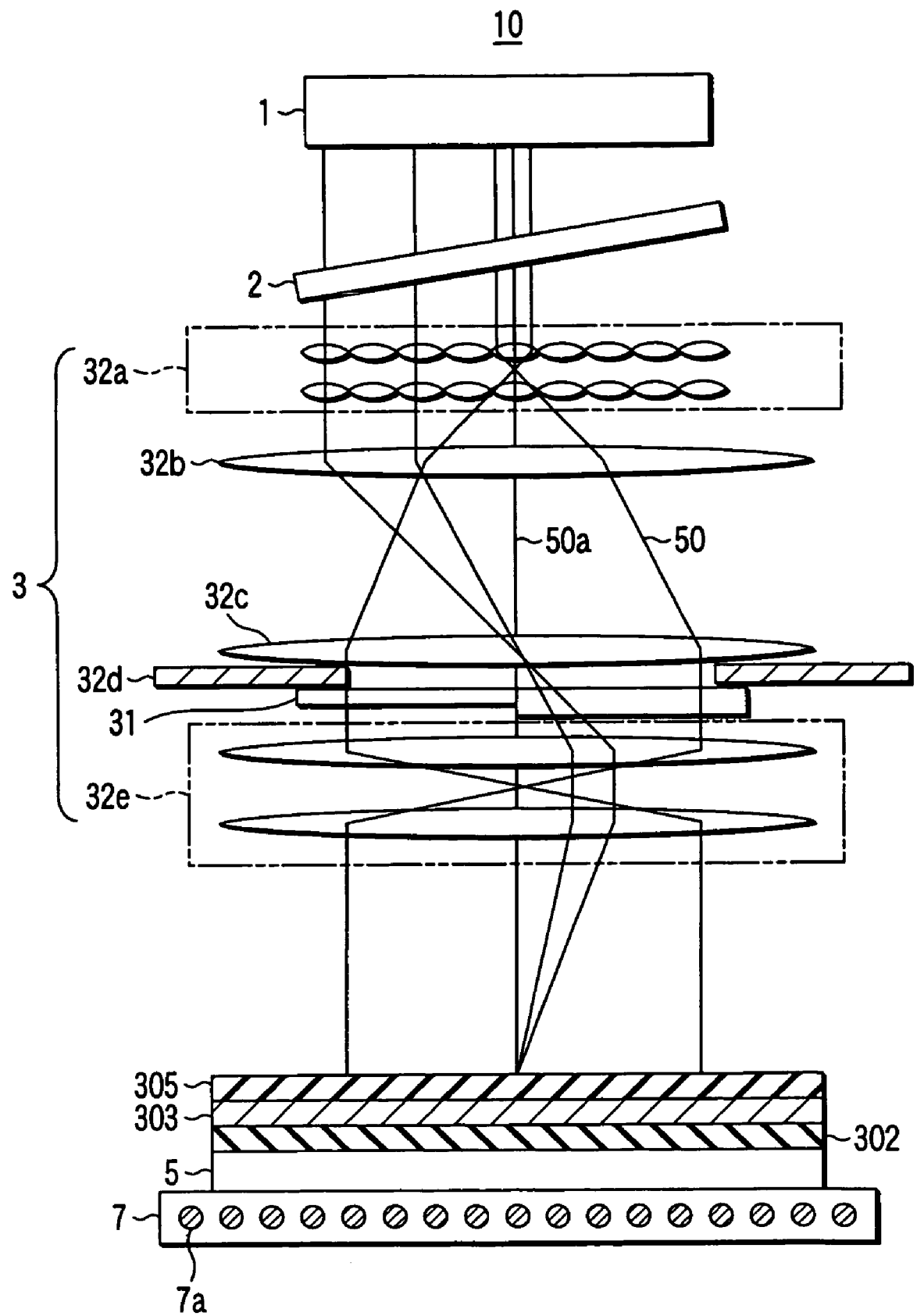
F I G. 4

Removing gate interlayer →

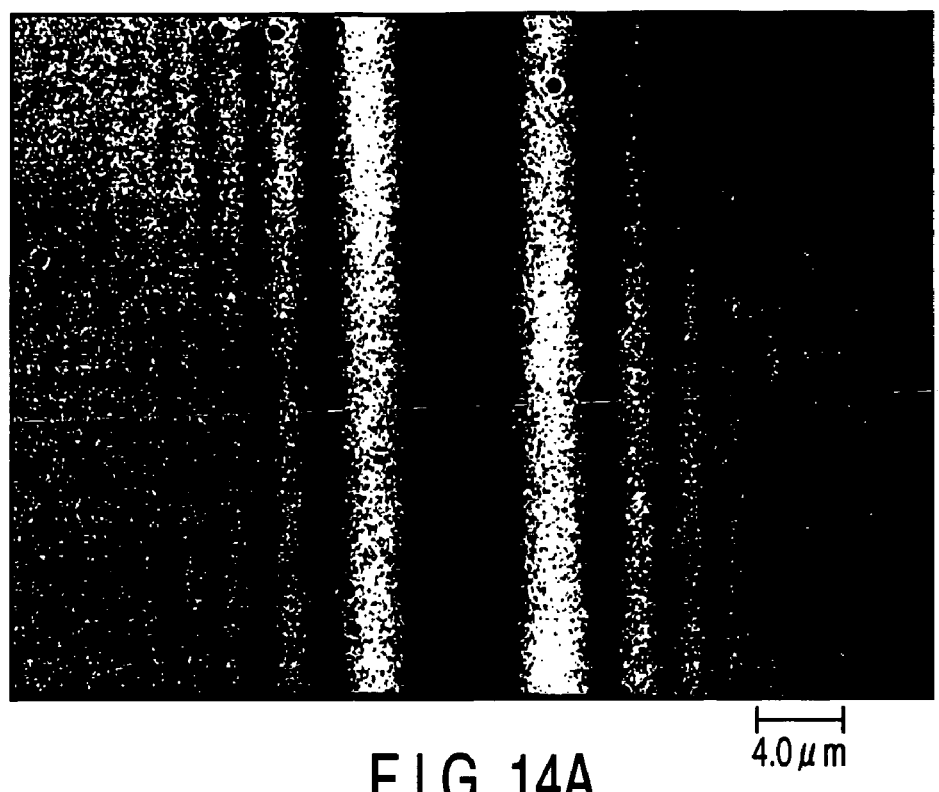
F I G. 14A
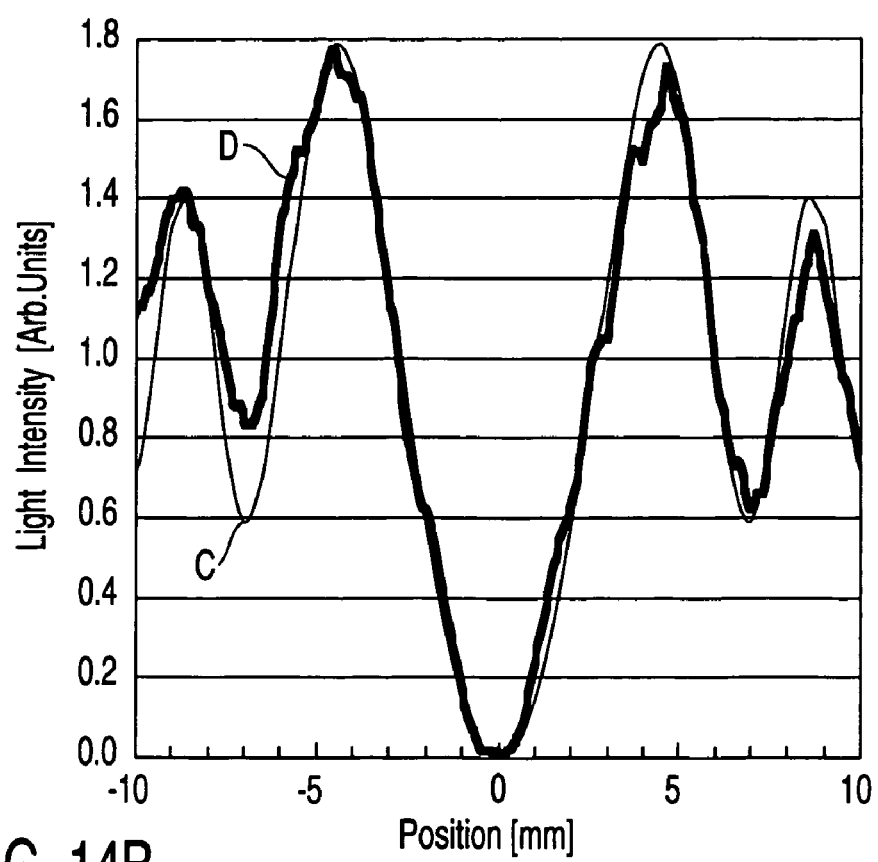
F I G. 14B

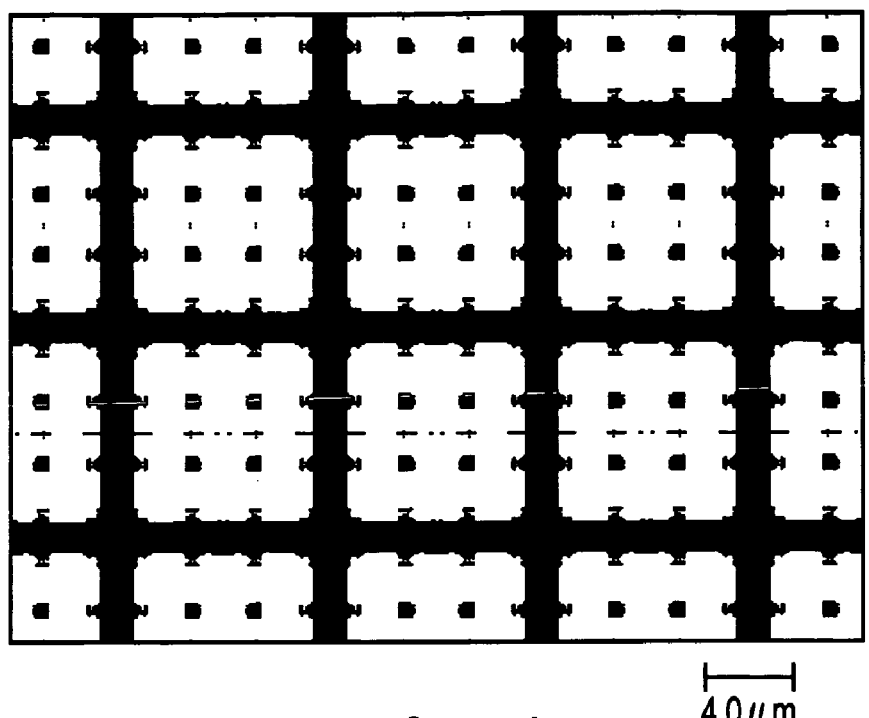
F I G. 15A
⊢——⊣
4.0 μm
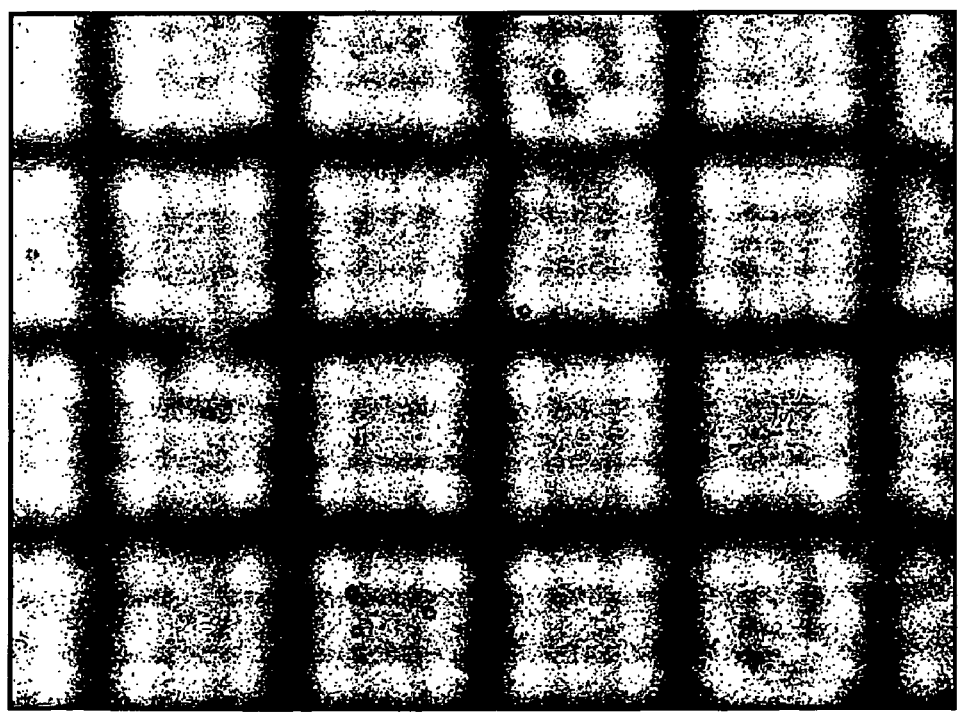
F I G. 15B
⊢——⊣
4.0 μm

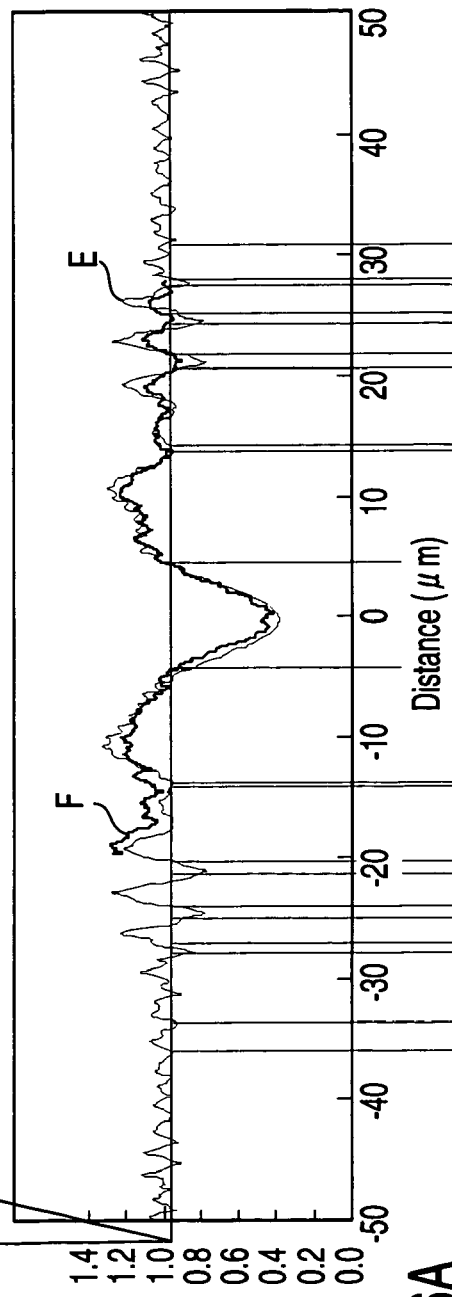
F I G. 16A
F I G. 16B

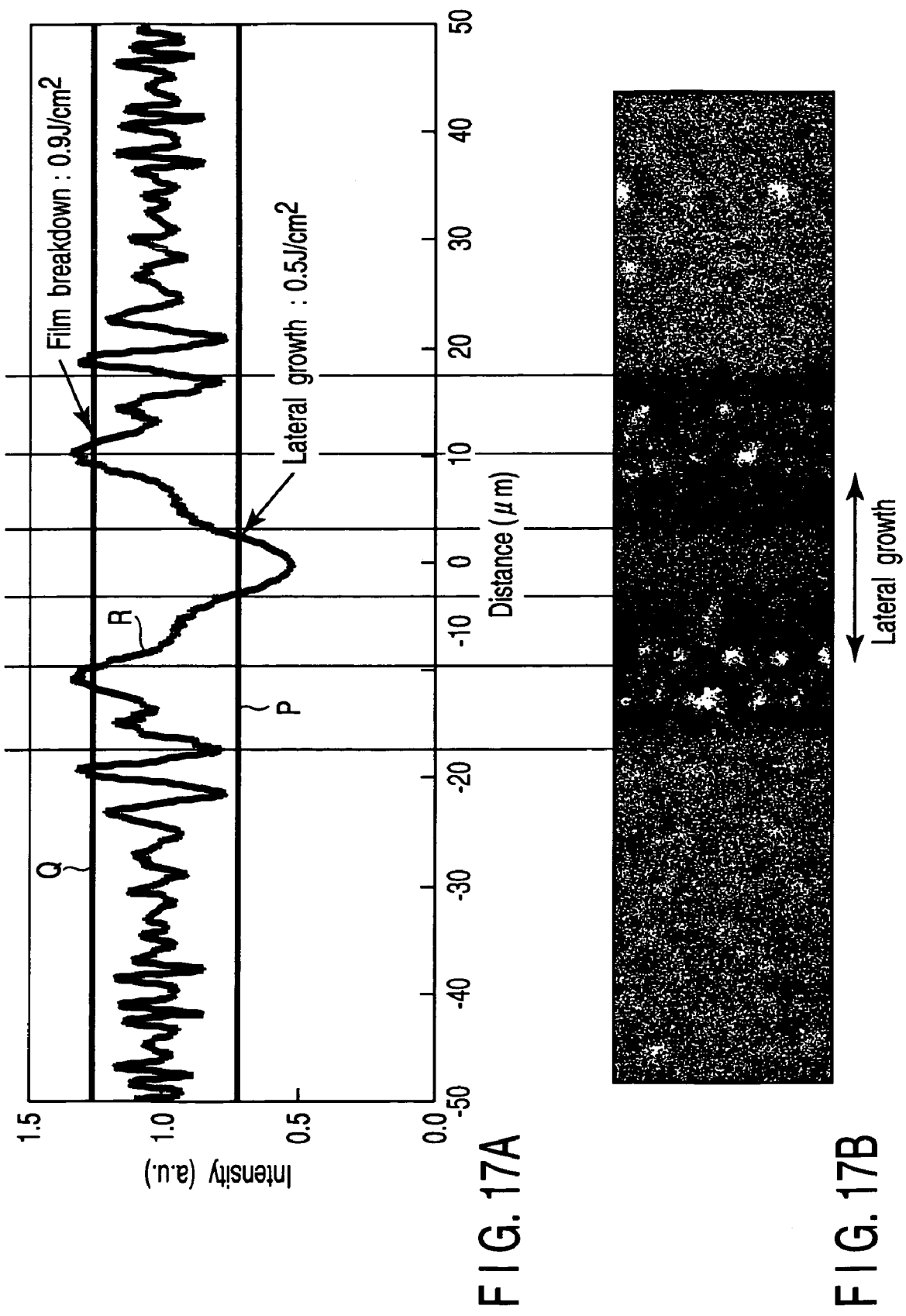
F I G. 17A
F I G. 17B

LASER ANNEALING METHOD

CROSS-REFERENCE TO RELATED APPLICATIONS

This application is based on and claims the benefit of priority from the prior Japanese Patent Applications No. 2002—279608, filed on Sep. 25, 2002; and No. 2003—110861, filed Apr. 15, 2003, and also claims the benefit of priority under 35 U.S.C. §120 to U.S. Appl. Ser. No. 10/668,285, filed Sep. 24, 2003 now U.S. Pat. No. 6,870,126, the entire contents of each are incorporated herein by reference.

BACKGROUND OF THE INVENTION

1. Field of the Invention

The present invention relates to a technology for manufacturing a field-effect transistor on the surface layer portion of a polycrystalline film (polycrystalline semiconductor thin film), a polycrystalline semiconductor thin film substrate for manufacturing the Field-Effect Transistor, and a semiconductor device for manufacturing electronic devices, such as liquid crystal display apparatuses and information processing devices, having the Field-Effect Transistor installed therein. The present invention also relates to an annealing method, an annealing apparatus for manufacturing the semiconductor device, and a display apparatus using the semiconductor device.

2. Description of the Related Art

As a display system of a liquid crystal display (LCD), use is made of an active matrix system in which display is performed by turning on each pixel. To turn on individual pixels in the active matrix system, a kind of field-effect transistor, an amorphous silicon thin film transistor (hereinafter, referred to as "a-SiTFT"), is mostly used.

Liquid crystal displays have been investigated and developed with the view toward attaining the technical purposes: (i) improving accuracy, (ii) increasing an aperture ratio, (iii) reducing weight, and (iv) reducing cost. To attain these purposes, Field-Effect Transistor, namely, a polycrystalline silicon thin film transistor (hereinafter referred to as "poly-SiTFT") has been recently received attention in place of the a-SiTFT. Poly-SiTFT has a field-effect mobility of carrier higher than a-SiTFT by two orders of magnitude. By virtue of this, the device formed of the poly-SiTFT can be reduced in size and a circuit can be integrated. As a result, a driving circuit and an arithmetic circuit can be mounted on a liquid crystal display.

Such a Poly-SiTFT is manufactured by an excimer laser crystallization method, which is detailed in "flat panel display" 1999, Nikkei Micro Device, Supplemental Edition (Nikkei BP Co., Ltd. 1998, pp. 132–139).

Referring now to FIGS. 1A to 1D, a method of manufacturing a poly-SiTFT by conventional excimer laser crystallization will be explained. As shown in FIG. 1A, first, an underlying layer protection film 102 (e.g. $SiO_2$ film, SiN film, and $SiN/SiO_2$ laminate film) and an amorphous silicon thin film 103 are sequentially deposited on a glass substrate 5. Then, as shown in FIG. 1B, when the amorphous silicon thin film 103 is irradiated with an excimer laser 50 (e.g., XeCl, KrF) having a square or rectangular shape formed by use of an optical system, the amorphous structure of the amorphous silicon thin film 103 is changed into a polycrystalline structure within an extremely short period of 50 to 100 nanoseconds through a melting/solidification step. When the excimer laser 50 is scanned over the substrate in the direction of the arrow 105, and locally and rapidly heated and cooled, a polycrystalline silicon thin film 106 is formed as shown in FIG. 1C.

Using the polycrystalline silicon thin film 106 shown in FIG. 1C, the thin film transistor shown in FIG. 1D is manufactured. On the polycrystalline silicon thin film 106, a $SiO_2$ gate insulating film 107 is formed. Furthermore, an impurity element is doped into predetermined regions of the polycrystalline silicon thin film 106, a source and drain regions 109, 108 are formed. A channel region 106 is located between the source region 109 and the drain region 108. A gate electrode 110 is formed on the gate insulting film 107; a protection film 111 is formed; and then a source electrode 112 and a drain electrode 113 are formed. When voltage is applied to the gate electrode 110 of the poly-SiTFT, the current flowing between the source region 109 and the drain region 108 is controlled.

In general, the TFT used in a pixel under the active matrix control is required for maintaining charge but not required to have an extremely high mobility (field-effect mobility). Rather, a low off-state current (quiescent current) must be supplied. To reduce the off-state current, it is necessary to increase the channel length of the TFT so as not to reduce the aperture ratio of a pixel by reducing the electric field strength of the end of the drain region, with the result that the pixel TFT becomes relatively large.

On the other hand, it is necessary that the TFT used in a driving circuit and an arithmetic circuit is operated at a high speed. Consequently, a high mobility but the off-state current is a matter of concern. In particular, the high-speed operation can be attained effectively by reducing the channel length. Therefore, the channel length of a TFT is reduced. As a result, the size of a TFT for use in driving circuit and arithmetic circuits becomes small.

As described above, the characteristics and sizes of TFTs required for a pixel and for driving/arithmetic circuits completely differ. All these TFTs are desirably formed together on the same substrate by substantially the same step. If not, economical merits brought by the integration of different type TFTs in a liquid crystal display cannot be obtained.

However, the conventional laser annealing method mentioned above has a problem in that only a poly-Si thin film having a uniform crystallinity is formed. If different-sized TFTs are formed on the same substrate formed by the conventional method, the following problems (i) and (ii) may inevitably occur.

(i) A large TFT has a large number of grain boundaries in the channel region. As a result, the variance of voltages becomes low (off-state current is low); however, the operation is performed at a low speed.

(ii) A small TFT has a small number of grain boundaries in the channel region. As a result, the operation can be performed at a high speed; however, variance of voltage becomes large (off-state current is high).

As described above, in the conventional method, it has been impossible to form various TFTs different in size and characteristics on the same substrate.

BRIEF SUMMARY OF THE INVENTION

An object of the present invention is to provide a semiconductor device capable of forming a semiconductor layer having not smaller than two types of crystal grains different in average diameter directly or indirectly on the same substrate, with the result that the diameter of the crystal grains is controlled so as to have the same average number (Na) of crystal grain boundaries across the current direction in a channel region (serving as an active layer) of TFTs different in size. The present invention is also directed to providing an annealing method, annealing apparatus and display apparatus for manufacturing the semiconductor device.

The semiconductor device of the present invention comprises a semiconductor layer having not smaller than two types of crystal grains different in average grain diameter in a semiconductor device circuit on a same substrate.

A semiconductor device comprising not smaller than two types of field effect transistors using a semi-conductor layer directly or indirectly formed on the substrate as a channel region, in which, a frequency distribution with respect to ratios of Na/L of the transistors falls within ±5%, where the L is a gate length of a transistor, and the Na is an average number of crystal grain boundaries across the direction of current flowing through the transistor.

The frequency distribution with respect to ratios of the Na/L of the transistors falls within ±2%. Further, the device may have a circuit layer on the substrate for actuating the transistor.

The annealing method of the present invention comprises the steps of;

setting target values with respect to intensity of laser light and distribution of the intensity in advance;

preparing a beam profile modulating section between a laser source and an irradiation region and preparing a substrate and a beam profile measuring section so as to interchangeably load and unload into the irradiation region;

placing the beam profile measuring section in the irradiation region, emitting laser light from the light source, modulating the intensity of the laser light and distribution of the intensity by the beam profile modulating section, and measuring the intensity of the laser light and incident on the irradiation region and the distribution of the intensity by the beam profile measuring section;

adjusting parameters of the beam profile modulating section based on the measuring results such that the measuring results match with the target values;

placing the substrate in the irradiation region such that the incident surface of the substrate is positioned in the irradiation region, thereby aligning the substrate with the beam profile modulating section;

irradiating the substrate with the laser light modulated by the beam profile modulating section when the measurement results match with the targets; and repeating the alignment step and the laser irradiation step to form a semiconductor substrate having not smaller than two types of crystal grains different in diameter therein.

The annealing apparatus of the present invention comprises a laser source;

a beam profile modulating section arranged between the laser source and an irradiation region, for modulating intensity of laser light and distribution of the intensity;

a beam profile measuring section for measuring intensity of laser light of an incident surface of the irradiation region and the distribution of the intensity;

means for setting target values with respect to the intensity of laser light and distribution of the intensity in advance; and a control section for controlling parameters of the beam profile modulating section such that the results measured by the beam profile measuring section match with the target values set above.

The beam profile measuring section is preferably arranged in the same plane as the substrate.

The beam profile modulating section uses an image forming optical system having a phase shifter as a spatial intensity modulating optical element.

An annealing method according to the present invention comprises setting and storing a target beam profile in a memory apparatus, recalling the target beam profile from the memory apparatus and setting an annealing beam profile with reference to the target beam profile thus recalled, and irradiating an amorphous single crystalline semiconductor layer with laser light.

The annealing apparatus according to the present invention is characterized in that a target beam profile is set and stored in a memory apparatus, the target beam profile is recalled from the memory apparatus, an annealing beam profile is set with reference to the target beam profile thus recalled, and a non single crystalline semiconductor layer is irradiated with laser light.

The display apparatus according to the present invention comprises a pair of substrates mutually joined with a predetermined gap and an electrochemical substance held in the gap, a counter electrode formed on one of the substrates, a pixel having electrode formed on other substrate a crystalline semiconductor thin film electrically connected the pixel electrode, a pixel drive circuit for driving the pixel, and a semiconductor thin film formed on the pixel drive circuit.

Each of the crystalline semiconductor thin film is formed:

(a) inserting a spatial intensity modulating optical element between a laser source and a beam profile measuring section;

controlling gap d1 between an incident surface of the beam profile measuring section and the spatial intensity modulating optical element at 500 µm or less;

measuring intensity of laser light modulated by the spatial intensity modulating optical element and applied to the incident surface of the beam profile measuring section, distribution of the intensity and the gap d, individually;

(b) inserting the spatial intensity modulating optical element between a substrate having a non single crystalline semiconductor thin film and the laser source, controlling gap d1 between an incident surface of the substrate and the spatial intensity modulating optical element to 500 µm or less, irradiating the incident surface of the substrate with the laser light modulated by the spatial intensity modulating optical element, and measuring the intensity of laser light, distribution of the intensity and the gap d1 when it is confirmed that lateral crystallization of the semiconductor thin film proceeds by irradiation of the modulated laser light;

(c) setting the measurement results in step (a) corresponding to those in step (b) as target values of the intensity of laser light, distribution of the intensity, and the gap d1;

(d) controlling intensity of laser light, distribution of the intensity and the gap d1 so as to match with the target values and irradiating the incident surface of the substrate with the laser light modulated by the spatial intensity modulating optical element under the control conditions; and (e) forming a semiconductor layer having not smaller than two types of crystal grains different in average diameter in the same substrate by repeating steps (b) to (d) mentioned above.

As described above, a semiconductor layer having not smaller than two types of crystal grains different in average diameter in the same substrate can be formed by repeating measurement of an average intensity (laser fluence) of laser light and distribution of the intensity (beam profile), gap arrangement and alignment, and laser irradiation.

Note that measurement, aligning, and irradiation are not necessarily repeated every time. Instead, all measurements are first performed, the measurement results are stored, the operational amounts required for alignment are obtained based on the measurement results recalled, the alignment and irradiation may be simultaneously performed for each crystallization region.

The present invention is concerned with a so-called proximity system comprising placing a phase shifter at a predetermined portion in the proximity of a substrate and irradiating laser light having a predetermined fluence. The proximity system may be used in combination with a projection system in which a phase shifter is arranged at a position near a laser source away from a substrate.

The term "beam profile" used in the specification refers to a two-dimensional intensity distribution of light incident upon an amorphous crystalline semi-conductor layer for use in crystallization. Note that the beam intensity of the profiler (beam profile) may be low since the beam profile is normalized.

The term "laser fluence" used in the specification is a unit indicating the energy density of laser-light, which is obtained by integrating the energy amount per unit area by time. To be more specifically, the "laser fluence" is an average intensity of laser light measured at a laser source or in an irradiation region.

The term "phase shifter" used in the specification refers to a spatial intensity modulating optical element for modulating light such as laser light to distribute light such that its intensity varies spatially. The "phase shifter" used herein is a spatial intensity modulating optical element used in an excimer laser crystallization method but differs from a "phase shift mask" used in a light-exposure step of a photolithography process of a semiconductor device.

BRIEF DESCRIPTION OF THE SEVERAL VIEWS OF THE DRAWING

FIG. 4 is an illustration showing the optical system of the annealing apparatus of FIG. 2;

FIG. 14A is a scanning electron-microscope (SEM) photograph showing a one-dimensional beam profile on a beam profiler fluorescent surface;

FIG. 14B is a characteristic line graph of the one-dimensional beam profile;

FIG. 15A is a computer simulation image of a two-dimensional beam profile;

FIG. 15B is a scanning electron-microscope (SEM) photograph showing a second-dimensional beam profile on the beam profiler fluorescent surface;

FIG. 16A is a characteristic line graph of a beam profile in which crystallization simulation results and actual results are shown;

FIG. 16B is an SEM photograph showing amorphous Si and crystalline Si of the laser irradiation region;

FIG. 17A is a characteristic line graph showing the relationship between lateral growth/film breaking and laser-fluence;

FIG. 17B is an SEM photograph of a Si thin film during the lateral growth;

DETAILED DESCRIPTION OF THE INVENTION

Preferable embodiments of the present invention will be now explained with reference to the accompanying drawings.

(First Embodiment)

Figure 1A:
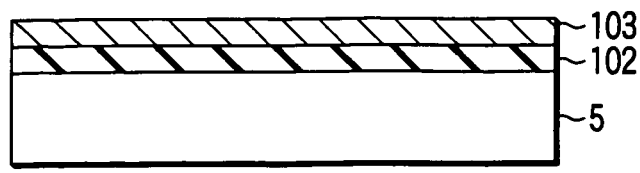
FIGS. 1A to 1C are schematic sectional views for illustrating a conventional annealing method.
Figure 1B:
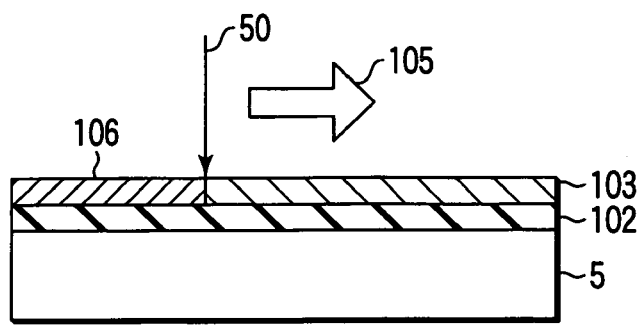
Figure 1C:
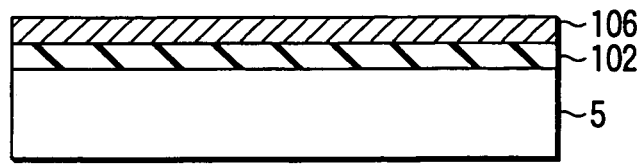
Figure 1D:
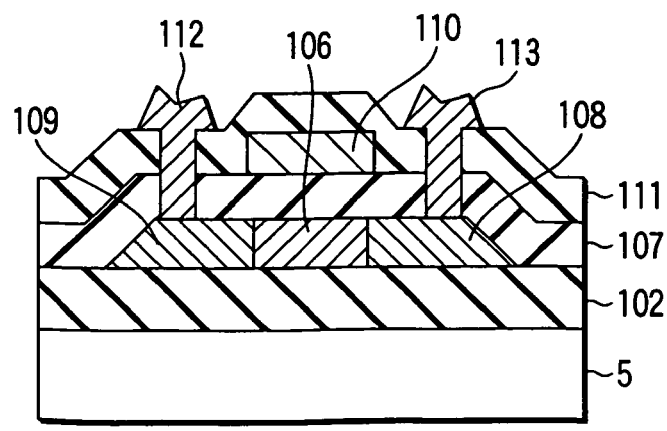
FIG. 1D are a schematic sectional view of the structure of a conventional semiconductor device.
Figure 2:
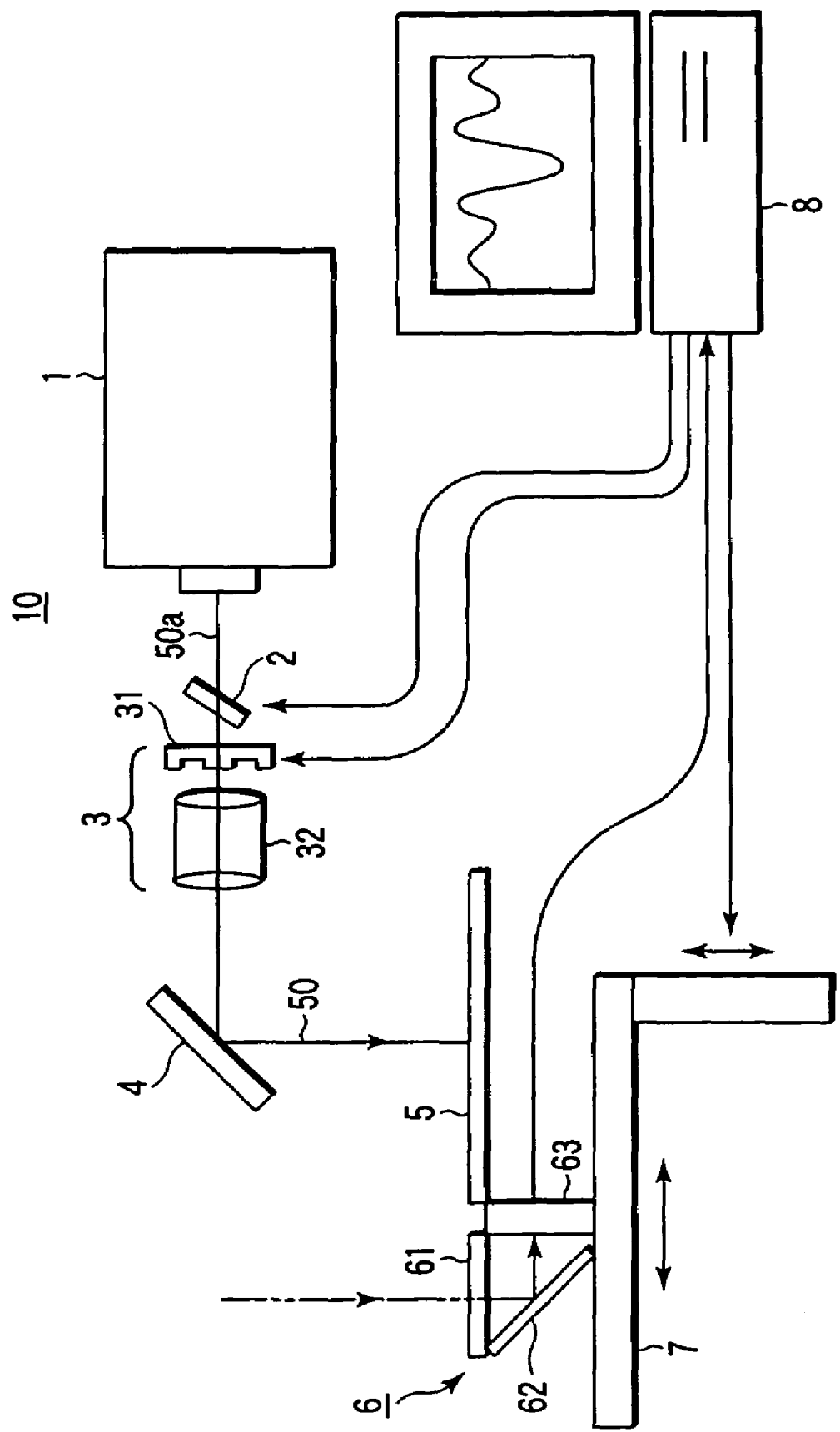
FIG. 2 is a schematic view of the entire structure of an annealing apparatus, a projection type laser annealing apparatus, according to the present invention.

FIG. 2 shows a laser crystallization apparatus 10 of this embodiment, a projection type laser annealing apparatus, which has an attenuator 2 and a beam profile modulator 3 near a laser source 1. A mirror 4 is arranged downstream of the beam profile modulator 3 for reflecting laser light 50 to apply it to a substrate 5 arranged at the target end of a laser optical axis 50a.

On a movable stage 7, the substrate 5 and a beam profiler 6 are arranged next to each other. They are independently moved in the directions X, Y, and Z by the movable stage 7 and aligned with light derived from the light source.

Figure 6:
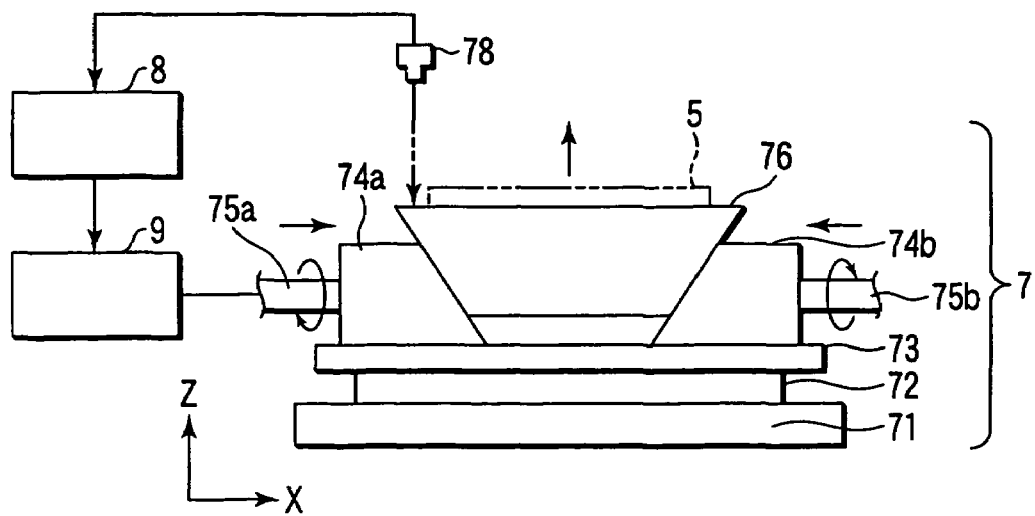
FIG. 6 is a sectional view of an alignment mechanism of a substrate stage with a block diagram of peripheral structural elements.

The movable stage 7 generally has three stages 71, 72 and 73, as shown in, for example, FIG. 6. To explain more specifically, the X stage 71 is movably held on a linear guide (not shown). On the X stage 71, the Y stage 72 is movably held. Further on the Y stage 72, the Z stage 73 is movably held. The substrate is mounted on the Z stage 73. Furthermore, a driving mechanism, a θ rotation stage (not shown) for rotating the Z stage 73 about the Z-axis may be added. The movable stage 7 has a heater 7a for heating the substrate 5 to a predetermined temperature.

On the main body of the Z stage 73, right and left sliders 74a, 74b are arranged to slidably move along the linear guide (not shown). The surfaces of both sliders 74a and 74b facing each other are inclined such that the sliders taper from bottom to top. Between the both sliders 74a and 74b, an up-and-down table 76 is provided so as to slidably move along the inclined surface. In other words, the inclined surfaces of the up-and-down table 76 match with the inclined surfaces of both sliders 74a and 74b. The substrate 5 is mounted on the up-and-down table 76. The side portions of the sliders 74a and 74b are respectively connected to the corresponding ends of ball screws 75a and 75b. The other ends of the ball screws 75a and 75b are jointed to a rotation driving shaft of an up-and-down driving mechanism 9 formed of a precision electric motor such as a stepping motor or a servomotor. A capacity sensor 78 is provided (above the up-and-down table 76) so as to detect the level of the upper surface of the up-and-down table 76. When a height detection signal is sent from the sensor 78 to a controller 8, the controller controls the operation of the up-and-down driving mechanism 9 to rotate both the ball screws 75a and 75b, thereby moving up and down the up-and-down table 76. In this manner, the substrate 6 can be precisely aligned with the light derived from the laser source.

Figure 3:
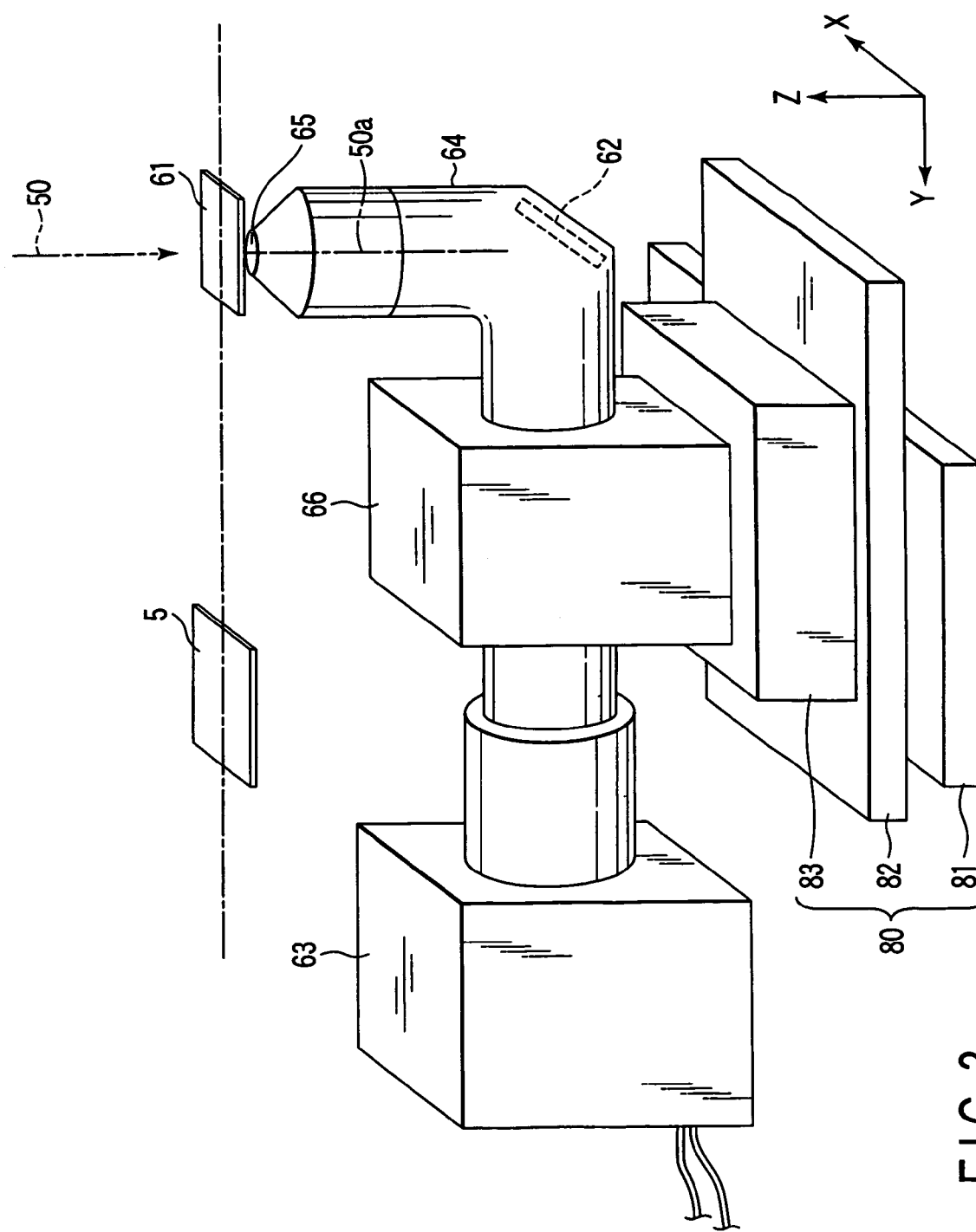
FIG. 3 is a perspective view of an optical system of the annealing apparatus.

FIG. 3 shows the optical system of the beam profiler 6, which is arranged such that its optical axis matches with that 50a of the laser source. The beam profiler 6 is mounted on an alignment mechanism 80, which is moved in the X, Y, and Z directions in synchronisms with the movable stage 7. Incidentally, the alignment mechanism 80 may be formed on the movable stage 7.

The alignment mechanism 80 has X, Y and Z stages 81, 82 and 83. The X stage 81 is movably held on a linear guide (not shown). On the X stage 81, the Y stage 82 is movably held. On the Y stage 82, the Z stage 83 is movably held. Further on the Z stage 83, a holding table 66 of the beam profiler 6. The level of the upper surface of the Z stage 83 is detected by a sensor (not shown). The height hz of the Z stage 83 is controlled by a personal computer 8 based on the height detection signal.

The holding table 66 has an optical wave-guide 64. The optical wave-guide 64 arranged horizontal is bent upward at a right angle at one side. A mirror 62 is arranged at the bending portion and an objective lens 65 is arranged at the top end. The objective lens 65 are arranged in proximity with the rear surface of a transparent fluorescent plate 61. The other end of the optical wave-guide 64 is optically connected to a CCD camera 63.

When ultraviolet excimer laser 50 is received by the fluorescent plate 61 of the beam profiler 6 it is converted into visible light, which is reflected at the mirror 62 and received by the CCD camera 63. In this manner, the beam profiler 6 measures the intensity of laser light and beam profile simultaneously.

In addition, a personal computer 8 is arranged to control the attenuator 2, beam profile modulator 3, and movable stage 7. The beam profiler 6 is connected to an input terminal of the personal computer 8, whereas the attenuator 2, the profile modulator 3, and movable stage 7 serving as a control system, are individually connected to the output terminal thereof. The picture data taken by the CCD camera 63 is transmitted to the personal computer 8 and processed therein.

The laser source 1 has a laser system (laser oscillator) emitting a KrF excimer laser of 248 nm wavelength. The laser system is capable of emitting laser light 50, which has a fluence sufficient to melt an amorphous silicon film 303 on the substrate 5, along the optical axis 50a.

Figure 5:
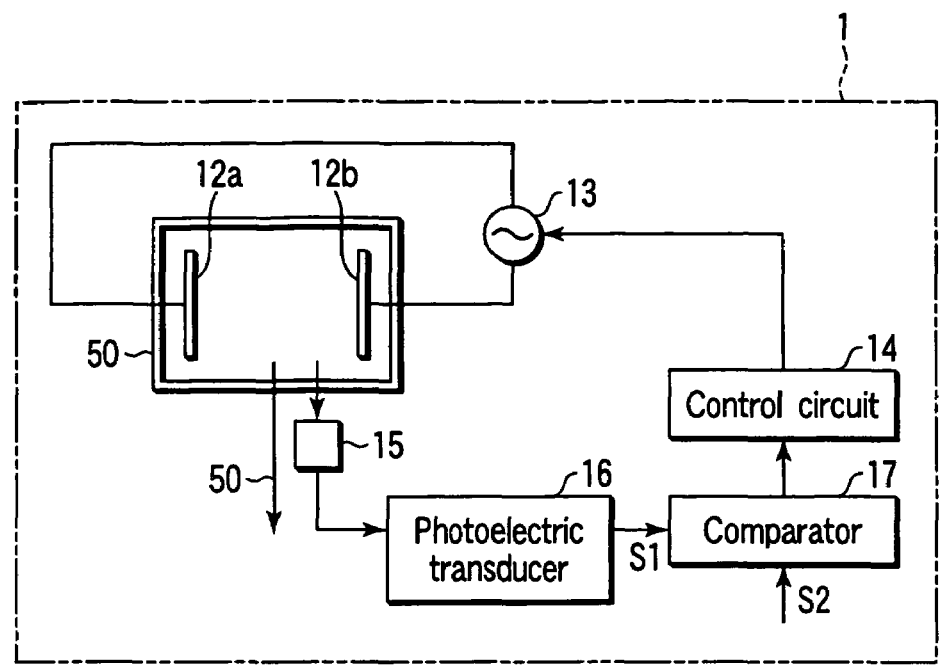
FIG. 5 is a circuit diagram showing a laser source with a block diagram of peripheral structural elements.

The attenuator 2 has a function of optically modulating the intensity (amplitude) of laser light by controlling the angle of dielectric multi-film coating filter and also has a sensor, motor, and a control system (not shown). In the apparatus 10 of this embodiment, the laser light 50 is emitted from the light source 1 and modulated by the attenuator 2 into the fluence having a desired level intensity. However, the laser source 1 itself may have a laser fluence adjusting function. More specifically, a control circuit 14, an optical sensor 15, an optical/electrical converter 16, and a comparator 17 are arranged in the light source 1, as shown in FIG. 5. The laser light 50 emitted from a vacuum container 11 of the laser oscillation apparatus is detected by the sensor 15 and converted into an electrical signal S1 by the optical/electrical converter 16, compared with a threshold signal S2 by the comparator 17. Based on the comparative results, the control circuit 14 controls a power source 13 to regulate the current to be applied across electrodes 12a and 12b of the laser oscillation apparatus in a feedback manner. If the light source 1 configured as mentioned above, the attenuator 2 may not be used.

The beam profile modulator 3 has a function for modulating the spatial distribution of the intensity of laser light and configured of a phase shifter 31 and image-forming optical system 32. According to the apparatus 10 of the embodiment, a projection system is employed in which the phase shifter 31 is arranged close to the laser source 1 far away from the substrate 5.

As shown in FIG. 4, the image forming optical system 32 is configured of a homogenizer 32a, a first condenser lens 32b, a second condenser lens 32c, a mask 32d, a phase shifter 31, and telecentric type reducing lens 32e, which are arranged sequentially from the light source side along the laser optical axis 50a.

The homogenizer 32a has a function of equalizing the laser beams emitted from the light source 1. The first condenser lens 32b, which is arranged in couple with the second condenser lens 32c, converges the equalized laser beams from the homogenizer 32a. In the optical path of the light beams emitted from the second condenser lens 32c, the mask 32d is arranged, which interrupts a non-effective laser beam. The reducing lens 32e has a function of reducing the size of an image in the range of between 1/1–1/20 and arranged in couple with the insulating cap film 305 formed on the substrate 5.

The phase shifter 31 is arranged in the close proximity of the mask 32d so as to cover the opening of the mask 32d. Note that the phase shifter 31 has an alignment mechanism having a sensor, an actuator, and a control system, for exchanging the mask 32d and aligning with the optical axis.

As described later, the distance between the phase shifter 31 and the mask 32d can be controlled accurately by an alignment mechanism described later.

Figure 7:
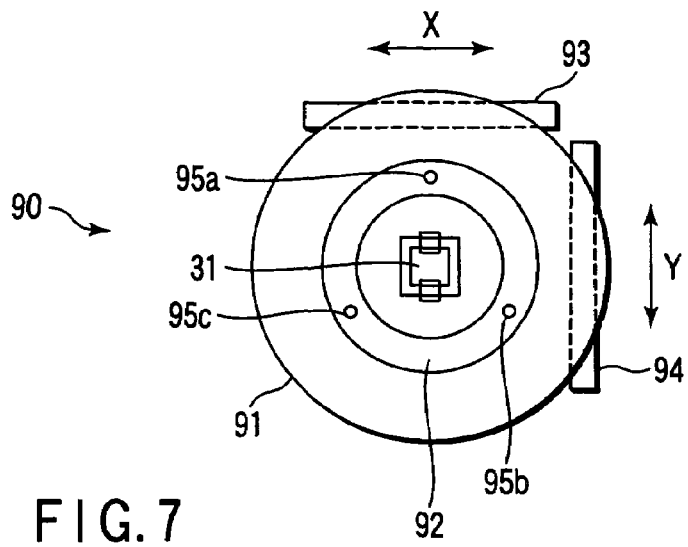
FIG. 7 is a plan view of an alignment mechanism of a phase shifter.

The alignment mechanism of the phase shifter 31 will be explained with reference to FIGS. 7 and 8. The phase shifter 31 is movably held by the holder 90. As shown in FIG. 7, the holder 90 has a concentric outer ring 91 and inner ring 92 mutually connected. The outer ring 91 is movably supported by the X driving mechanism 93 and Y driving mechanism 94 so as to move in the X and Y directions with fine pitches.

Figure 8:
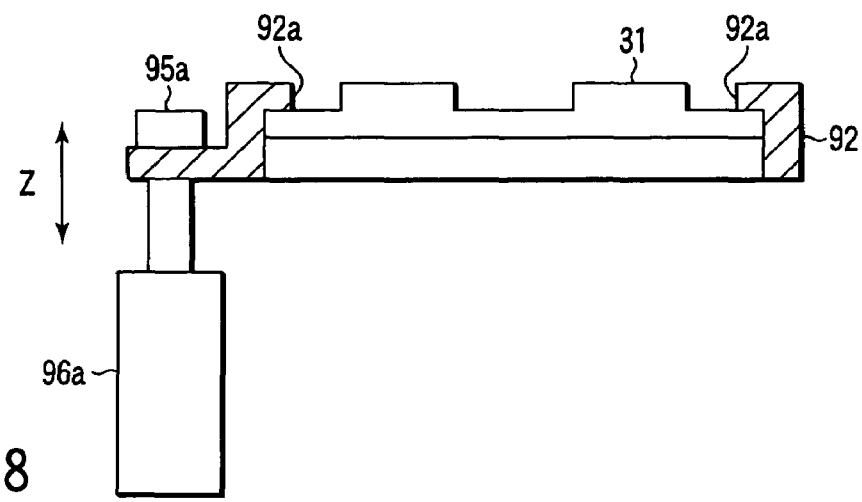
FIG. 8 is a magnified sectional view of a part of the alignment mechanism of the phase shifter.

The inner ring 92 has a plurality of stoppers 92a for holding the phase shifter 31, as shown in FIG. 8. The phase shifter 31 is fit inside the inner ring 92 and the stoppers 92a hold its periphery. The inner ring 92 is supported by pivots 95a, 95b and 95c. Two of the pivots 95a, 95b and 95c are connected to a rod of a cylinder 96a (only one is shown in the figure for convenience sake). The controller 8 controls the moving amount of the Z direction of each cylinder rod based on the position-detecting signal sent from a capacity sensor (not shown) to thereby align the phase shifter 31 with the X-Y surface (called surface alignment of the phase shifter).

In this manner, the phase shifter 31 is precisely aligned with other members of the image forming optical system 32. The height (gap d) of the phase shifter used herein is defined as the distance between the phase shifter and the mask.

Figure 9:
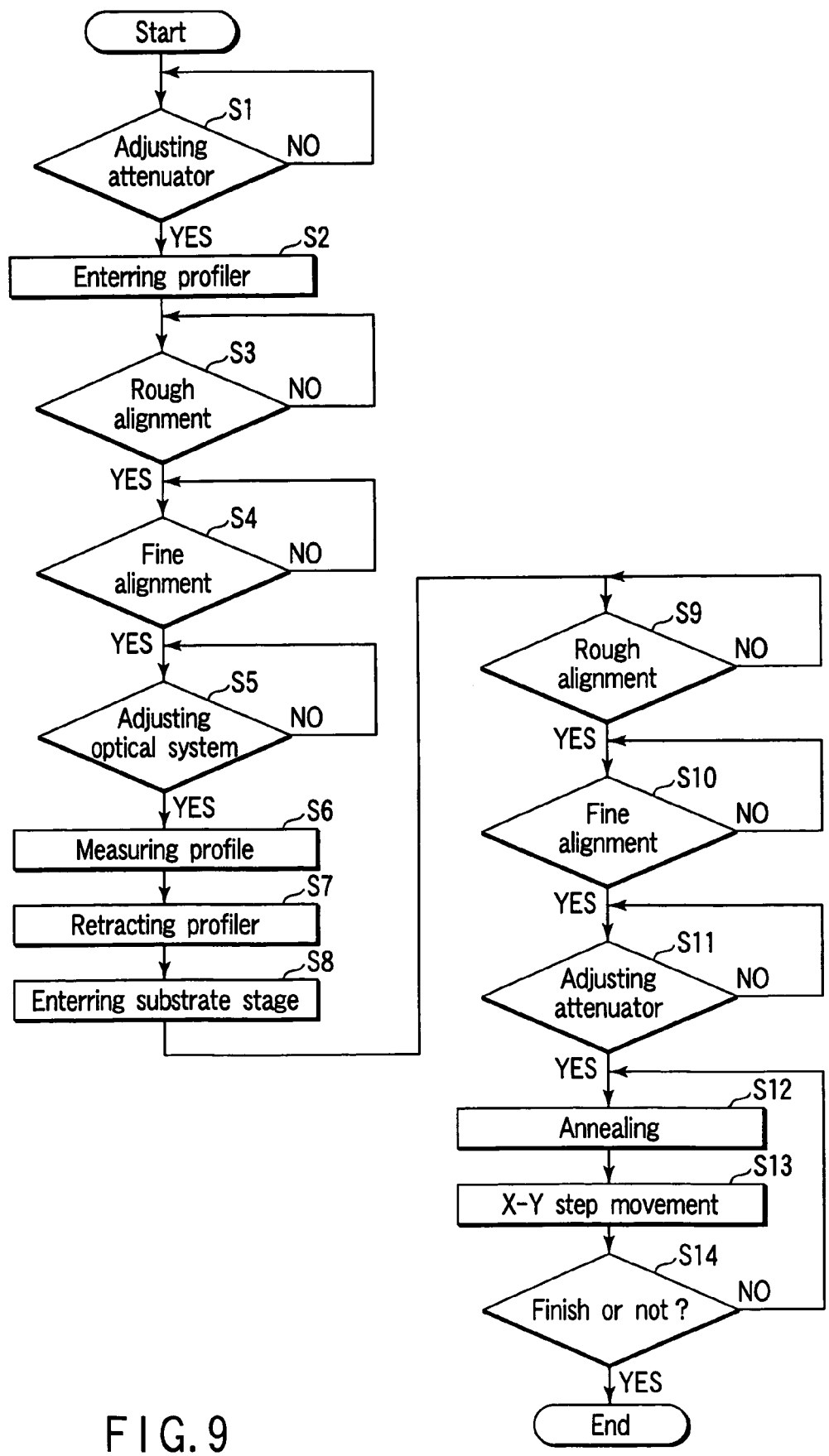
FIG. 9 is a flowchart of an annealing method of the present invention.

Now, referring to FIG. 9, the case where a specific region of the amorphous silicon film is crystallized by the annealing apparatus of the present invention will be explained.

First, the magnification of the attenuator is adjusted at 1/100 (Step S1). Then, the profiler 6 is allowed to enter to position at the irradiation region (Step S2). The optical axis of the profiler 6 is roughly aligned with that 50a of the light source by use of alignment mechanisms 7 and 80 (Step S3). The optical axis of the profiler 6 is precisely aligned with the light axis 50a of the light source by the alignment mechanisms 7 and 80 (Step S4).

Subsequently, the phase shifter 31 is aligned with the mask 32d by the alignment mechanism 90 to set gap d between the phase shifter 31 and the mask 32d at a predetermined value. In this manner, a modulation optical system is prepared (Step S5).

In a laser crystallization step, first, the movable state 7 is moved horizontally to bring the tip of the optical axis 50a of the laser source 1 to point at the fluorescent plate 61 of the beam profiler 6. laser light is applied to the fluorescent plate 61 and the intensity of beam profile is measured (Step S6). At this time, a desired beam profile is determined with reference to the shape of the phase sifter 31 and the distance between the phase shifter and a semiconductor substrate 5, the intensity distribution of laser light, and the angular distribution of laser light. The image forming optical system 32 is composed of optical parts such as lenses. Laser light is applied to the substrate 5 while the substrate 5 is held on a position out of the focus of the image forming optical system 32. Based on the mask pattern used at this time and the defocus amount, the shape and width of a beam profile of the reverse peak pattern are controlled. The width of the peak pattern increases in proportional to square root of the defocus amount. In this manner, a beam profile is measured (Step S6).

The bundle of light applied to a given point of the substrate surface is composed of split beams including the center beam passing through the optical axis 50a. The angle of a certain beam with respect to the center beam is determined by multiplying the angle of the certain beam with respect to the center beam on the mask 32d, which is determined by a geometric shape of the homogenizer 32a, by the magnification of the telecentric type lens 32e.

The phase shifter 31 has a predetermined step portion 31a, which causes the Fresnel diffraction to individual split beams. Since the diffraction patterns of the individual beams are superposed on the substrate surface, the light intensity distribution of the substrate surface is determined by not only parameters (gap d, phase difference θ) of the phase shifter 31 but also the degree (ε) of spreading the beams incident upon the phase shifter 31 as well as the interference between the beams. The phase shifter 31 shifts the phase of the light 50 passed through the mask 32d along the optical axis 50a alternately between 0 and π. After the beam profile is measured, the profiler 6 is removed from the irradiation area (Step S7) and the substrate stage is introduced into the irradiation region (Step S8). By using the alignment mechanisms 7 and 80, the incident surface of the substrate 5 is roughly aligned with the optical axis 50a of the light source (Step S9). Subsequently, the incident surface of the substrate 5 is precisely aligned with the optical axis 50a of the light source by the alignment mechanisms 7 and 80. (Step S10). When the substrate 5 is aligned with the optical system 32 in this manner, the substrate 5 is positioned at a image-forming site of the reducing lens 32e.

Next, the angle of the attenuator 2 is adjusted such that the measured intensity and the beam profile match with preset targets, respectively. More specifically, the initial magnification of the attenuator (1/100) is multiplied 100 fold to 1, equal to the size of the real image (Step S11).

After the movable stage 7 is moved horizontally to bring the tip of the optical axis 50a to point at a predetermined crystal region of the semiconductor substrate 5, the substrate 5 is irradiated with laser light having a predetermined intensity and beam profile. More specifically, the amorphous silicon film 303 is irradiated with pulse laser light having the beam profile A shown in FIG. 10A and annealed to form small crystal grains r1 shown in FIG. 10B (Step S12). The laser light 50, whose fluence is first optically modified by adjusting the angle of the dielectric multi-film coating filter at the attenuator 2, is divided into scattered beams by the homogenizer 32a formed of two pairs of small lenses (respectively placed in the X axis and Y axis). One shot is given for 30 nanoseconds. The center-axis beams of individual scattered beams thus split are converged into the center of the mask 32d by the condenser lens 32b. Since individual beams are slightly scattered, the entire surface of the mask 32d can be illuminated. All light beams emitted from micro emission regions divided are applied to all points on the mask 32d. Therefore, even if the light intensity of the laser emission surface slightly varies depending upon points within the plane of the laser emitting surface, the light intensity of the mask 32d becomes uniform.

The center-axis light beams of the beams passing through individual regions of the mask 32d, in other words, the scattered light beams passed through the lens pairs 32b, 32c placed in the middle of the homogenizer 32a are formed into parallel beams by the convex lens 32c arranged in the vicinity of the mask pattern, pass through the telecentric type reducing lens 32e, and vertically enters into the substrate 5.

Figure 10A:
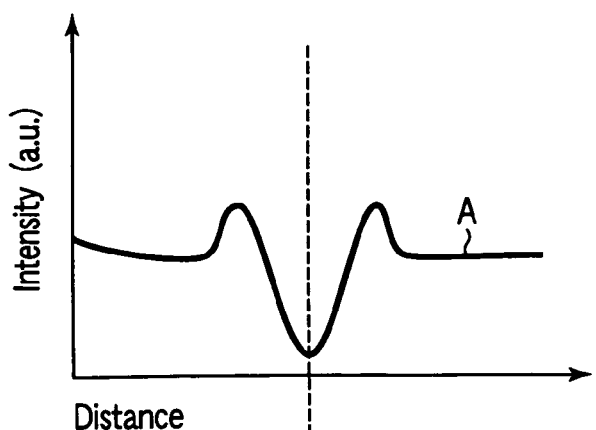
FIG. 10A shows beam profile A.
Figure 10B:
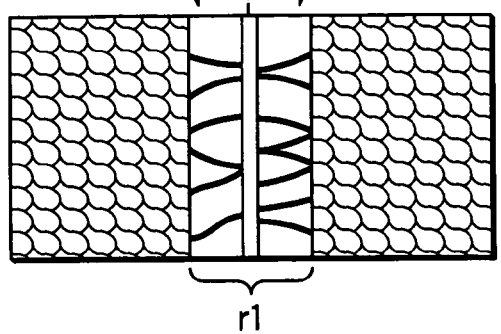
FIG. 10B is a schematic view showing a crystal region of small grains formed by irradiation with a laser having beam profile A.
Figure 10C:
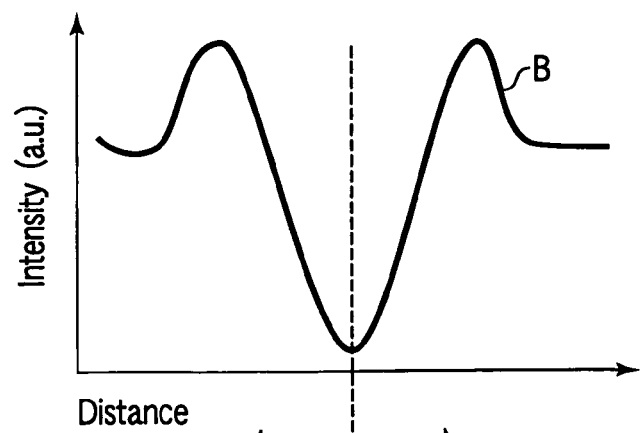
FIG. 10C shows beam profile B.
Figure 10D:
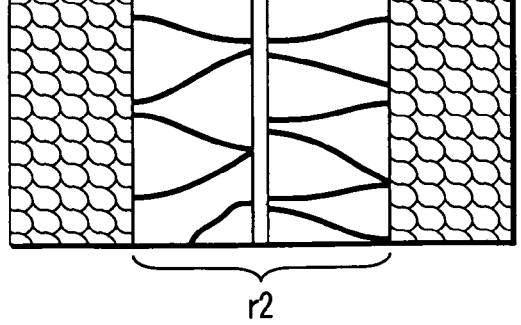
FIG. 10D is a schematic view showing a crystal region of large grains formed by irradiation with a laser having the beam profile B.

When the amorphous silicon film 303 is irradiated with a pulse laser beam having the beam profile shown in FIG. 10C and annealed, large crystal grains r2 shown in FIG. 10D are formed (Step S12). In this manner, the large crystal grains r2 are formed in a predetermined region of the silicon film.

The position of the movable stage 7 can be changed by moving it step by step at predetermined intervals within the X-Y plane. Annealing is repeated while gradually changing the irradiation region in this manner to perform crystallization of a large area (Step S13). The light beams passed through the same point of the mask 32d are converged into a single point of the substrate surface. More specifically, a reduced image of the mask 32d is formed in the substrate surface with uniform intensity. Reference symbols X and Y used herein refer to the X-axis and Y-axis, and reference symbol Z refers to the perpendicular axis to the horizontal plane.

The intensity of laser light may be separately measured by a semiconductor power meter. Alternatively, ultraviolet excimer laser may be directly applied to the CCD 63.

The fluorescent plate 61 is arranged on the same plane as the semiconductor substrate 5 or on the plane vertically in parallel to the semiconductor substrate 5. When the fluorescent plate 61 is arranged on the plane vertically in parallel to the semiconductor substrate 5 at a different level, the movable stage 7 is moved up and down to position the fluorescent plate 61 at the same level as the semiconductor substrate 5.

In this manner, the beam profile of the laser applied on the substrate surface can be measured under the same conditions of actual irradiation time.

The image formed on the CCD 63 is input in the personal computer 8 and sliced by a given scanning line (sampled on a raster basis) to measure the intensity. The intensity and the beam profile of the laser light are measured based on the intensity distribution of the image signal.

Next, by comparing the measured intensity to a preset target intensity, the operation amount of the attenuator 2 is determined. The angle of attenuator 2 is controlled by sending an operation signal to the attenuator 2 in a feed back manner until a measured intensity reaches the target intensity.

On the other hand, by comparing the measured beam profile to a preset target beam profile, the operation amounts of the beam profile modulator 31 and the movable stage 7 are determined. The position of the phase shifter 31 and the height of the movable stage 7 are controlled by sending operational signals to the beam profile modulator 3 and the movable stage 7, in a feedback manner, until a measured beam profile reaches a the target beam profile.

It is determined whether the region irradiated just before should be the last one or not (Step S14). When the determination result of Step S14 is "NO", the annealing step of Step S12 is performed. In contrast, when the determination result of Step S14 is "YES", the substrate stage is returned to a home position, thereby terminating the crystallization process.

By repeating measurement, alignment, and irradiation, it is possible to simultaneously form the TFT substrate having different crystalline regions in the channel region, more specifically, the crystalline regions formed of different-size grains but having the same average number (Na) of grain boundaries across the current direction.

The measurement, alignment and irradiation may not be necessarily performed alternately. Instead, all measurements are first performed to obtain the operational amounts required for alignment. Thereafter, the alignment and irradiation may be simultaneously performed at every crystallization region.

EXAMPLE

As an example of the present invention, TFT-A (small size TFT) and TFT-B (large size TFT) having the same characteristics but different in size were prepared as follows.

Figure 11A:
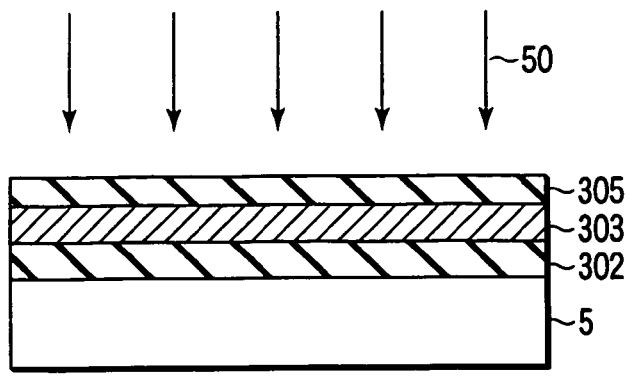
FIG. 11A is a schematic sectional view for illustrating the annealing method of the present invention.

First, a substrate was prepared as shown in FIG. 11A. On the surface of an insulating substrate 5 (formed of, for example, corning 1737 glass, molten quartz, sapphire, plastic, or polyimide), an insulating protecting film 302 formed of 300 nm thick is formed. On the insulating substrate 5, an insulating protecting film 302 of 300 nm thick is formed. The insulating protecting film 302 may be a $SiO_2$ film formed by plasma chemical vapor deposition using, for example, tetraethylorthosilicate (TEOS) and $O_2$, $SiN/SiO_2$ laminate film, alumina, or mica. On the protecting film 302, an amorphous semiconductor film 303 (100 nm thick) such as a Si film or a SiGe film is formed by plasma chemical vapor deposition. On the amorphous semiconductor film 303, further a gate insulating film 305 (100 nm thick) such as a $SiO_2$ film is formed by plasma chemical vapor deposition using tetraethylorthosilicate (TEOS) and $O_2$. After the film formation, these thin films 302, 303, and 305 are subjected to the dehydrogenation treatment performed by heating under a nitrogen atmosphere at 600° C. for one hour.

As a next step, laser crystallization is performed by using the apparatus shown in FIG. 2. As a laser source 1, a high-energy laser emitting light by pulse oscillation, such as a KrF excimer laser, is used.

The laser light emitted from the laser source 1 passes through an attenuator 2 and a beam profile modulator 3 capable of modulating power and beam profile As a result, the power and the beam profile are modulated. Thereafter, the laser light passes through an optical element such as a mirror 4 and reaches the movable stage 7 having the semiconductor substrate 5 mounted thereon. The laser crystallization is performed by irradiating the semiconductor substrate 5 with the modulated laser light. On the movable stage 7, a beam profiler 6 capable of measuring beam profile And possibly used as a power meter is set up. The beam profiler 6 linked to a personal computer 8 to set the height hz of the movable stage 7 and optical parameters (the angle of the attenuator 2 and the position of a phase shifter 31, etc.), capable of modulating power and a beam profile so as to give a preferable beam profile.

The beam profile A shown in FIG. 10A is used for forming small grain crystal region r1 and the beam profile B shown in FIG. 10C is used for forming a large grain crystal region r2. The conditions for beam profiles A and B are set under the system in couple with the personal computer 8.

When the laser light 50 having beam profile A or B is applied to the amorphous silicon film 303, a poly-Si crystalline film having desired size crystal grains is formed. When the laser light of beam profile A is applied to a selected region r1, small grain size crystal is formed in the selected region r1, as shown in FIG. 10B. Also, when the laser light of beam profile B is applied to a selected region r2, large grain size crystal is formed in the selected region r2, as shown in FIG. 10D. In this manner, the crystalline regions different in size can be formed in the same substrate.

Figure 11B:
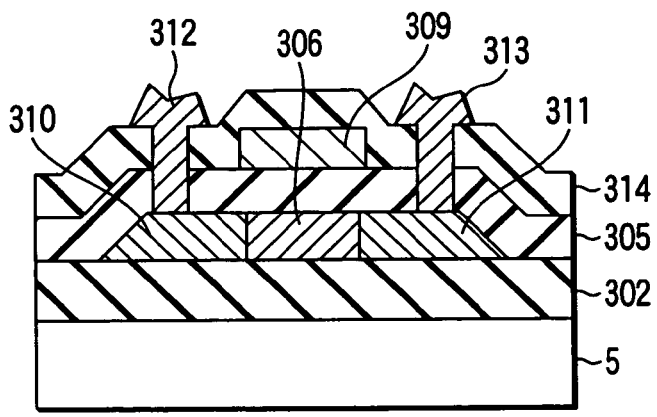
FIG. 11B is a schematic sectional view showing a semiconductor device of the present invention.

A thin film transistor shown in FIG. 11B is formed in this way.

An average number Na of grain boundaries across the current direction in the TFT channel region is evaluated as follows.

Figure 12A:
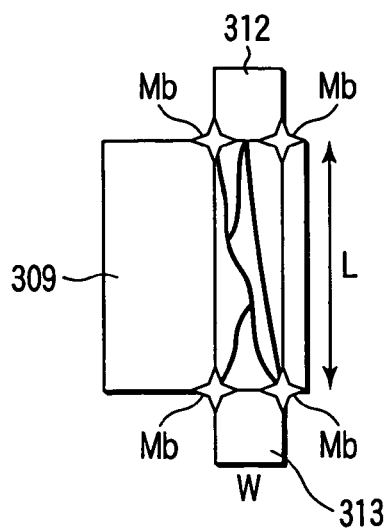
FIG. 12A is a schematic view of laser markers provided on an active layer of TFT.
Figure 12B:
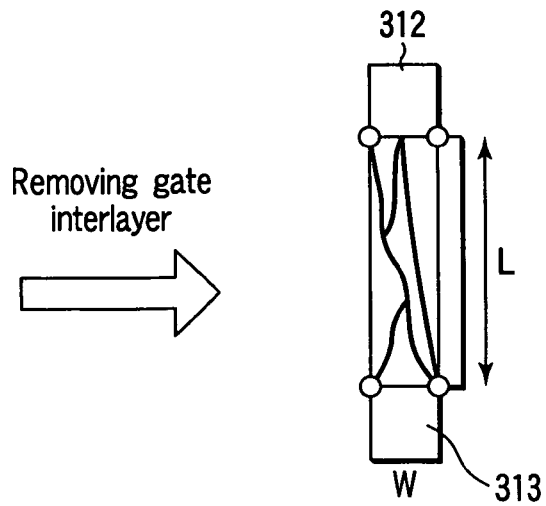
FIG. 12B is a schematic view of laser markers provided on the TFT active layer after removal of a gate interlayer film.

To clearly distinguish the edge of the active layer of TFT, four sites are marked with a laser marker Mb as shown in FIG. 12A. Next, as shown in FIG. 11B, the source electrode 312, drain electrode 313, gate electrode 309, and the interlayer insulating film 314 are removed with an acid such as hydrochloric acid or hydrofluoric acid to expose the active layer of the TFT, poly-Si layer 306. Subsequently, the TFT formation region is exposed to a mixing solution containing HF:K$_2$CrO$_3$ (0.15 mol/l)=2:1 for 30 seconds. This is called "Secco etching". In this way, the grain boundary is clearly differentiated. The etching surface is washed with water, dried and subjected to observation under scanning electromicrography. As the image observation apparatus, a surface roughness tester, or an inter atomic force microscope may be used.

The number of grain boundaries across the current in the channel region is counted as follows. The source region between two marking sites Mb and the drain region between two marking sites Mb each is divided into 10 equal portions to give straight lines in parallel to each other. The number of straight lines crossing the grain boundaries are counted and averaged to obtain the number of grain boundaries.

Since the size of grains is controlled by the beam profile, grain boundaries are present more densely in the small grain size crystal region r1 than in the large grain size crystal region r2.

The gate length La of TFT-A is set at 2 µm and the gate length Lb of the TFT-B was set at 4 µm. The width W of each of TFT-A and TFT-B was set at 2 µm.

Figure 13:
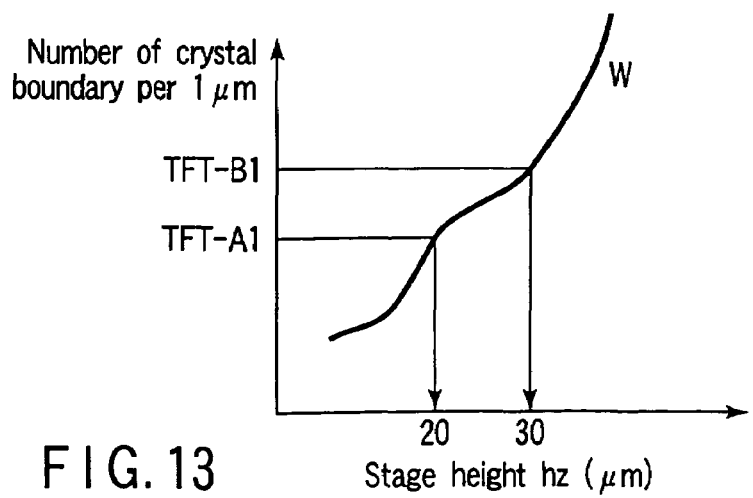
FIG. 13 is a characteristic line graph showing the relationship between the stage height $hz$ and the number of grain boundaries (average value Na) per 1 µm.

To obtain TFT having the same performance, the beam profiles A and B shown in FIGS. 10A and 10C were previously determined. As shown in FIG. 13, a desired profile was determined by an hz value based on the relationship between the height hz of the stage and the number of crystal grain boundaries per 1 µm. More specifically, assuming that the height d of the phase shifter is 0 (d=0 µm), the intensity of beam profile A required for TFT-A1 was 500 mJ/cm$^2$ (Condition 1) at hz=30 µm and the intensity of beam profile B required for TFT-B1 was 700 µm/cm$^2$ (Condition 2) at hz=20 µm.

Under the conditions 1 and 2, a plurality of regions in the substrate (amorphous silicon film) were irradiated with lasers having beam profiles A and B shown in FIGS. 10A and 10C to crystallize the amorphous silicon film.

The crystallized regions formed by these methods were patterned in accordance with TFT-A1 and TFT-B1 and the following process was performed.

As shown in FIG. 11B, the gate electrode 309 (high-phosphorus doped polysilicon, W, TiW, Wsi$_2$, or MoSi$_2$) was formed on the gate insulating film. Ions were implanted by using the gate electrode 309 as a mask to form a source region 311 and the drain region 310. More specifically, in the case of an N-type TFT, P$^+$ ions were implanted in an order of 10$^{15}$ cm$^{-2}$. In the case of a P-type TFT, BF$^{2+}$ ions were implanted in an order of 10$^{15}$ cm$^{-2}$. Thereafter, annealing was performed in an electric furnace at 500° C. to 600° C. for about one hour by using nitrogen as a carrier gas to activate impurities. Furthermore, rapid thermal annealing (RTA) was performed at 700° C. for one minute. Finally, the interlayer insulating film 314 was formed, a contact hole was formed and then the source and drain electrodes 312, 313 were formed. As the materials for the source and drain electrodes 312 and 313, Al, W or Al/TiN may be used.

(Evaluation Test)

In evaluating the obtained TFTs, five points of the substrate (350 mm×400 mm) were chosen. More specifically, four corner points and the intersectional point of two diagonal lines were evaluated.

In a region, thin film transistors (TFT-A1) of 2 µm width (d) and 2 µm length (La), and thin film transistors (TFT-B1) of 2 µm width (d) and 4 µm length (Lb) were formed with a predetermined pattern. TFT characteristics were measured at each of the 5 points. The same characteristics of TFT-A1 as those of TFT-B1 were obtained.

Furthermore, the ratio of Na/L, where Na is the average number Na of crystal grain boundaries across the current direction in the channel region and L is the gate length, was determined as follows. To distinguish the poly-Si layer of the TFT whose characteristics were determined, positional marking Mb and the upper layer structure were removed. The range of 50 µm×50 µm was evaluated by a scanning electromicroscope. The ratio of Na/L, where Na is the average number of crystal grain boundaries across the current direction in the channel region 306, and L is the gate length, in each of TFTs (TFT-A1 and TFT-B1) measured, was within the range of a frequency distribution of ±5% (standard deviation; meaning differences from a median value falls within a ±5% range of the median value).

When characteristics of TFTs formed in the present invention, were evaluated, TFT-A1 and TFT-B1 had the same performance (electron mobility: 250 cm$^2$ V/sec.), even though they were different in size.

When the most suitable height d was determined at the time of the beam profile determination while changing the height d of the phase shifter 31 under Conditions 1 and 2, the height d was 5 µm in TFT-A1 and 1 µm in TFT-B1.

In these conditions, TFT-A1 and TFT-B1 were manufactured. The ratio of Na/L, where Na is the average number of crystal grain boundaries across the current direction in the channel region, and L is the gate length, in each of TFTs (TFT-A1 and TFT-B1) measured, was within ±2% of the frequency distribution (standard deviation; meaning differences from a median value falls within a ±2% range of the median value).

When characteristics of TFTs formed in the present invention, were evaluated, TFT-A1 and TFT-B1 had the same performance (electron mobility: 250 cm$^2$ V/sec.), even though they were different in size.

Now, an application example in which the thin film transistor as obtained in the aforementioned embodiment was actually applied to an active matrix type liquid crystal apparatus, will be explained.

Figure 22:
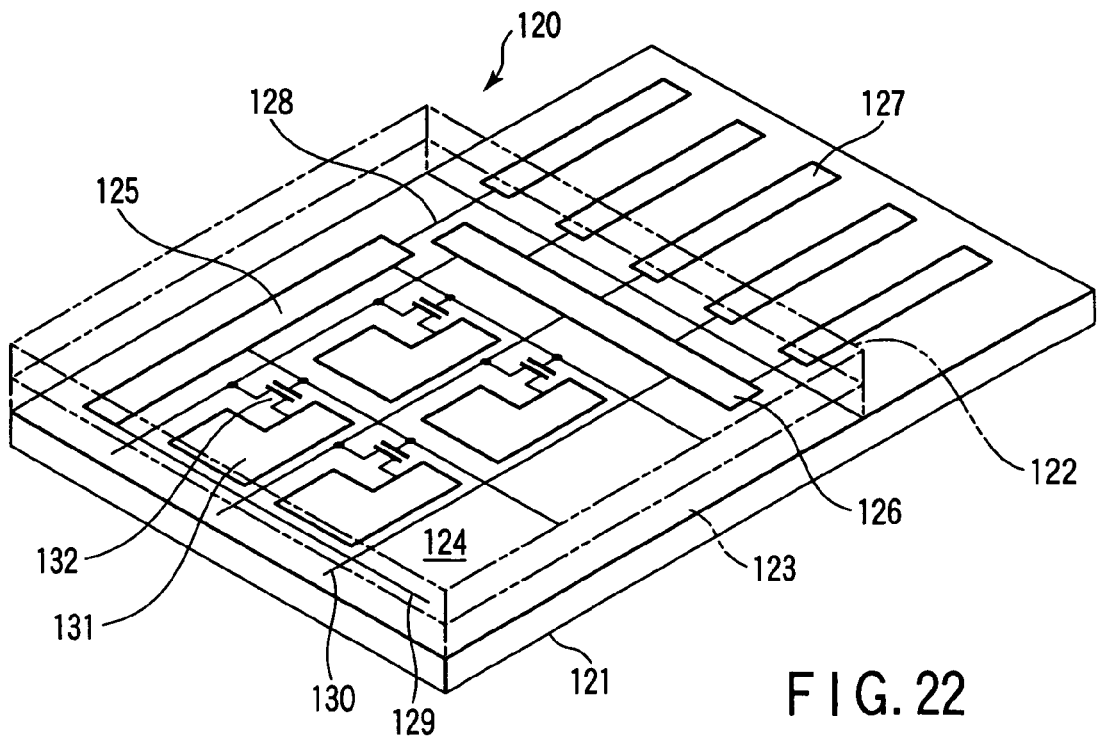
FIG. 22 is a perspective view of the display apparatus of the present invention.

FIG. 22 is a perspective view of an active matrix type display apparatus using a thin film transistor. A display apparatus 120 has a panel structure comprising a pair of insulating substrates 121 and 122 and an electrochemical substance 123 sandwiched between them. As the electrochemical substance 123, a liquid crystal material has been widely used. On the lower insulating substrate 121, a pixel array portion 124 and a driving circuit portion are integrally formed. The driving circuit portion is divided into a vertical driving circuit 125 and a horizontal driving circuit 126. Each of the driving circuits 125 and 126 has the thin film transistor, TFT-A1 (shown in FIGS. 11B and 10B), manufactured in accordance with the present invention.

On the insulating substrate 121 and at the upper side of the FIG. 22, terminals 127 for connecting to external elements are formed. The terminals 127 are also connected to the vertical driving circuit 125 and the horizontal driving circuit 126 via wiring 128. In the pixel array portion 124, gate wiring 129 and signal wiring 130 are formed as columns and rows. At the intersection between both wiring elements, a pixel electrode 131 and a thin film transistor 132 for driving the pixel electrode 131 are formed. The thin film transistor 132 corresponds to TFT-B1 (FIG. 11B and FIG. 11D) manufactured in accordance with the present invention and drives the pixel electrode 131 by turning on a switch.

The gate electrode 309 of TFT 132 for a pixel is connected to the corresponding gate wiring 129, the drain region 305 is connected to the corresponding pixel electrode 131, and the source region 310 is connected to the corresponding signal wiring 130. Furthermore, the gate wiring 129 is connected to the vertical driving circuit 125 and the signal wiring 130 is connected to the horizontal driving circuit 126.

In the driving circuit TFT-A1, variation of the threshold voltage is low compared to that of a conventional Poly-SiTFT, and therefore off-state voltage is low. TFT-A1 exhibits the same carrier mobility as the conventional Poly-SiTFT and can be operated at a high speed by turning on a switch.

On the other hand, the pixel TFT 132 (TFT-B1) has a large carrier mobility compared to a conventional Poly-SiTFT. High-speed operation can be made. TFT 132 (TFT-B1) has the same variation of threshold voltage as the conventional Poly-SiTFT and operated by a low off-state current.

(Second Embodiment)

As a second embodiment, a proximity type laser annealing apparatus and a method using the apparatus will be explained.

Figure 19:
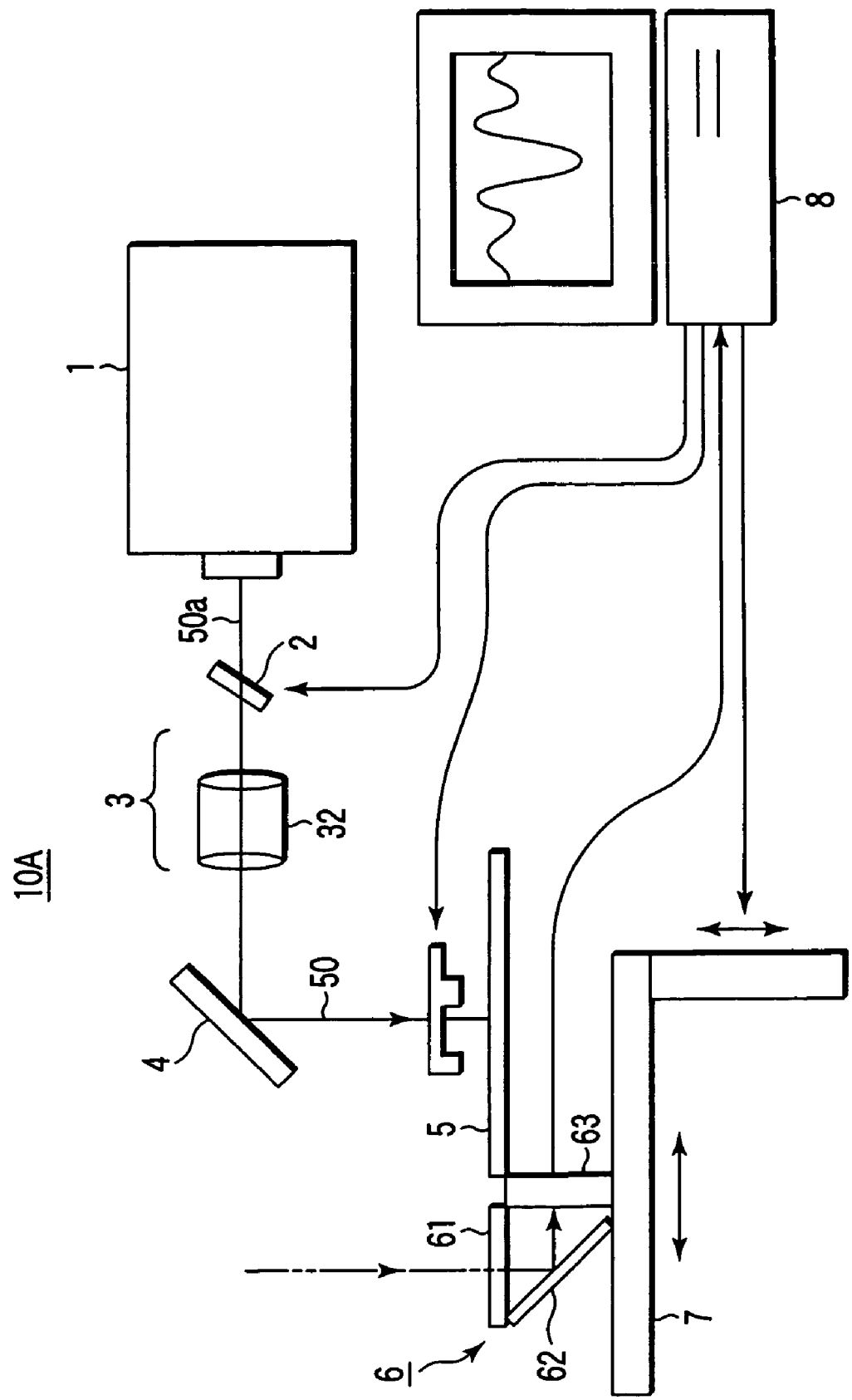
FIG. 19 is a schematic view of the entire structure of another annealing apparatus (proximity-type laser annealing apparatus) of the present invention.

As shown in FIG. 19, in a laser annealing apparatus 10A, an attenuator 2 and a homogeneous optical system 32 of a beam profile modulator 3 are arranged near the starting point of the optical axis 50a from a laser source 1. The optical axis passes through a mirror 4, and goes to a semiconductor substrate held on a movable stage 7. A phase shifter 31 of the beam profile modulator 3 is arranged near the incident surface of the semiconductor substrate 5 on the movable stage 7.

In the laser annealing apparatus 10A, a beam profiler 6 and the semiconductor substrate 5 are arranged next to each other and fixed on the movable stage 7.

In addition, a computer 8 is arranged for a control operation. A beam profiler 6 is connected to the input terminal of the computer 8 and the attenuator 2, the beam profile modulator 3, and control system C for the movable stage 7 are connected to the output terminals of the computer 8. The computer 8 independently controls the functions of these elements 2, 3, and 7.

The attenuator 2 optically modulates the light intensity (laser fluence) by controlling the angle of a dielectric multi-film coating filter and comprises a sensor, motor, and control unit (not shown) under the control of the computer 8. The term "laser fluence" is a yardstick expressing an energy density of a laser and obtained by integrating energy amount per unit area by time.

The beam profile modulator 3 modulates the spatial intensity distribution of laser light and comprises the phase shifter 31 and the homogeneous optical system 32.

The phase shifter 31 comprises a sensor, actuator, and control unit (not shown) for exchanging mask patterns and aligning with the optical axis.

The phase shifter 31 shifts the phase of light passing through the mask 32d alternately between 0 and π to produce a reverse peak pattern having a minimum light intensity at a phase shift portion. Using the reverse peak pattern, the position of a crystal nuclei of the amorphous semiconductor film on the semi-conductor substrate 5, which is a region first solidified, can be controlled. By growing a crystal laterally (lateral growth, which is a two-dimensional growth along a film surface) from the crystal nuclei, the large-diameter crystal grain is formed at a predetermined position. At this time, a desired beam profile is set based on the shape of the phase shifter and the distance of the phase shifter from the semiconductor substrate 5, and angular distribution of laser light (the angle of incident laser light).

Homogeneous optical system 32 is composed of an optical part such as a lens. The semiconductor substrate 5 is placed at an off-focus position of the homogeneous optical system 32 and irradiated with laser light. The shape and width of the reverse pattern are controlled by the mask pattern and the distance from the focus.

The width W of the reverse peak pattern increases in proportional to square root of gap d1 where d1 is the gap between the phase shifter 31 and the semiconductor substrate 5. That is $W=k \times d^{1/2}$ (k is the coefficient).

The beam profiler 6 converts ultraviolet excimer laser into a visible light upon receiving the ultraviolet excimer laser by a fluorescent plate 61. The visible light is reflected by the mirror 62 and received by the CCD 63. In this manner, the intensity of laser beam and beam profile are simultaneously measured. The light intensity of measurement system may not be limited as long as it is sufficient to measure a beam profile.

The intensity of laser light may be separately measured by use of a semiconductor power meter. Alternately, ultraviolet excimer laser may be directly received by the CCD 63.

The fluorescent plate 61 is placed on the same plane as the semiconductor substrate 5 or on the plane parallel to the semiconductor substrate 5. When the fluorescent plate 61 is arranged on the plane vertically in parallel to the semiconductor substrate 5 at a different level, the movable stage 7 is moved up and down to position the fluorescent plate 61 at the same level as the semiconductor substrate 5. In this manner, the beam profile of the laser applied on the substrate surface can be measured under the same conditions of actual irradiation time.

It is desirable that the fluorescent plate 61 is placed at an optically equivalent position as the surface of the semiconductor substrate 5. At that time, the fluorescent plate 61 has a moving mechanism for moving along the optical axis of the incident laser. When the fluorescent plate 61 is moved, the moving stage 7 may be moved up and down by the moving amount of the fluorescent plate 61.

The image formed on the CCD 63 is input into the computer 8 and sliced by a given scanning line (sampled on a raster basis). The intensity and the beam profile of the laser light are measured based on the intensity distribution of the image signal.

Next, by comparing the measured intensity to a preset target intensity, the operation amount of the attenuator 2 is determined. The angle of attenuator 2 is controlled by sending an operation signal to the attenuator 2 in a feed back manner until a measured intensity reaches the target intensity.

Alternatively, by comparing the measured beam profile to a preset target beam profile, the operation amounts of the beam profile modulator 3 and the movable stage 7 are determined. The position of the phase shifter 31 and the height of the movable stage 7 are controlled by sending operational signals to the beam profile modulator 3 and the movable stage 7, in a feedback manner, until a measured beam profile reaches a the target beam profile. In this embodiment, the intensity of laser light, laser light distribution, and gap d1 are controlled in a feedback manner. However, the present invention is not limited to this embodiment. Instead, all of the intensity of laser light, laser light distribution, and gap d1 are measured and stored in a memory as target values. These values may be separately recalled when laser irradiation is needed. In this way, it is possible to attain laser irradiation with high reproducibility and the crystallization of the TFT channel portion can be constantly performed.

The movable stage 7 may be moved three-dimensionally, that is, moved back and forth, left and right, and up and down. For alignment in in-plane and optical-axis directions, a sensor, actuator, and control system (not shown) are provided.

The term "a preset target intensity" is the laser intensity (laser fluence) or the distribution of the intensity (beam profile A) at mentioned later proof test (see FIG. 14A to FIG. 18C) which it is confirmed that an amorphous semiconductor thin film is crystallized, crystal grains laterally grows, and a crystallized film is not destroyed by thermal contraction.

Figure 20:
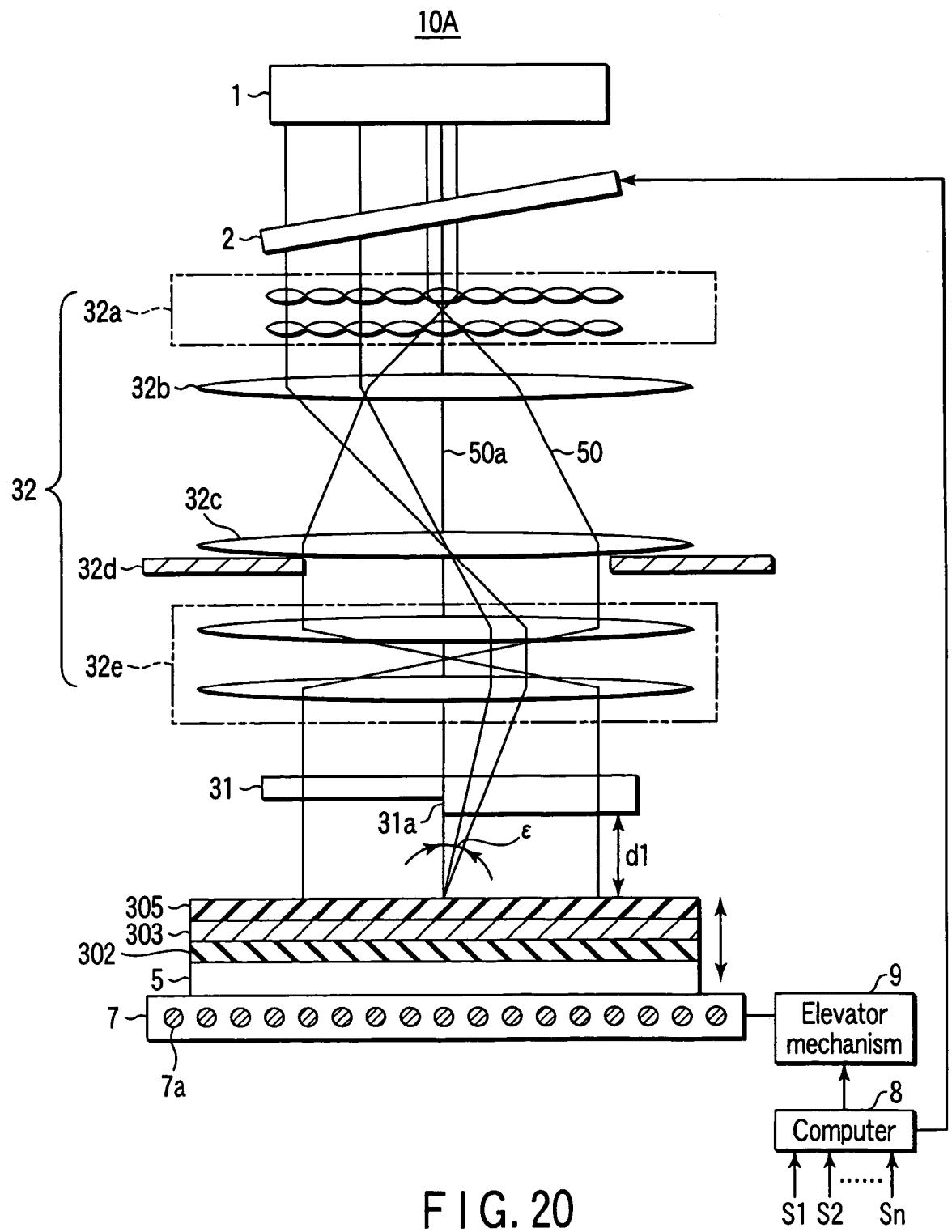
FIG. 20 is a sectional view of the optical system of the annealing apparatus of FIG. 19, together with a block diagram of peripheral structural elements.

Referring now to FIG. 20, the optical system of an annealing apparatus will be more specifically described.

The annealing apparatus 10A is used for irradiating a sample (refer to FIG. 11A) formed by stacking the underlayer protecting film 302, the amorphous Si film 303, and the cap film 305 sequentially on the substrate 5, with laser light 50 whose intensity and beam profile have been modified. The amorphous Si film 303 is the target to be crystallized. Both the underlying protection film 302 and the cap film 305 are $SiO_2$ insulating films.

A light source, a KrF excimer apparatus 1, emits a long laser beam 50 of a wavelength of 248 nm. The laser beam 50 is first modified by the attenuator 2. More specifically the laser fluence is optically modified by controlling the angle of the dielectric multi-film coating filter. Then, the laser beam 50 is divided into scattered beams by the homogenizer 32a comprising two small lens pairs in the X and Y directions. Note that one shot pulse is given for 30 nanoseconds. The center-axis beams of individual scattered beams thus divided are converged into the center of the mask 32d by the condenser lens 32b. (convex lens #1).

Since individual beams are slightly scattered, the entire surface of the mask 32d can be illuminated. All light beams emitted from micro emission regions divided are applied to all points on the mask 32d Therefore, even if the light intensity of the laser emission surface slightly varies depending upon points within the plane of the laser emitting surface, the light intensity of the mask 32d becomes uniform.

The center-axis light beams of the beams passing through individual regions of the mask 32d, in other words, the scattered light beams passed through the lens pairs placed in the middle of the homogenizer 32a are formed into parallel beams by the convex lens 32c arranged in the vicinity of the mask pattern, pass through the telecentric type reducing lens 32e, and vertically enters into the substrate 5 mounted on the movable stage 7 with a heater 7a.

The movable stage 7 can be moved in the X, Y and Z directions. If the substrate is irradiated while changing the irradiation regions by sliding the movable stage 7, and repeatedly annealed, it is possible to crystallize a large area of the substrate. The beams passed through the same site of the mask 32d are converged onto a single point of the substrate surface. In other words, a reduced image of the mask 32d can be formed on the substrate surface with a uniform intensity. Note that X and Y denotes the X axis and Y axis. Z denotes a perpendicular axis to a horizontal plane.

The light applied to a given point of the substrate surface is composed of beams including the center beam passing through the optical axis 50a. The angle of a certain beam with respect to the center beam is determined by multiplying the angle of the certain beam with respect to the center beam on the mask 32d, which is determined by a geometric shape of the homogenizer 32a, by the magnification of the telecentric type lens 32e.

The phase shifter 31 arranged at the distance of 500 μm from the sample has a step portion 31a, which causes Fresnel diffraction of individual beams. Since the diffraction patterns of the individual beams are superposed on the substrate surface, the light intensity distribution of the substrate surface is determined by not only parameters (gap d, phase difference θ) of the phase shifter 31 but also the degree (ε) of spreading the beams incident upon the phase shifter 31 as well as the interference between the beams.

The annealing apparatus of the present invention used in this embodiment is constructed as mentioned above. In the laser crystallization step, first the stage 7 is moved horizontally to bring the tip of the light axis 50a of the laser source 1 to point the fluorescent plate 61 of the beam profiler 6, and then laser beam is applied to the board 61 to measure the intensity of the laser beam and the beam profile.

Next, the angle of the attenuator 2, the position of the phase shifter 31, the height of the movable stage 7 are aligned with each other such that the measured intensity and the beam profile match with the preset target ones.

Subsequently, the movable stage 7 is horizontally moved to bring that the tip of the optical axis to point a predetermined crystallization region of the semiconductor substrate 5. The gap is set at d1. Thereafter, laser light having a predetermined intensity and beam profile is applied.

By repeating measurement, alignment, and irradiation, it is possible to simultaneously form the TFT substrate having different crystalline regions in the channel region, more specifically, the crystalline regions formed of different-size grains but having the same average number (Na) of grain boundaries across the current direction.

The measurement, alignment and irradiation may not be necessarily performed alternately. Instead, all measurements are first performed to obtain the operational amounts required for alignment. Thereafter, the alignment and irradiation may be simultaneously performed for each crystallization region.

(Proof Test)

Referring now to FIGS. 14A to 18C, the characteristics of modulated laser light are defined from the measurement results of the beam profile on the surface of a sample. The actual results were compared with simulation results; at the same time, the actual results and the morphology of the crystallized film are investigated. In addition, critical light intensity values are revealed.

FIG. 14A shows a one-dimensional normalized Fresnel diffraction pattern obtained by an isolated phase shifter (optical-path difference δ is 180°) when a parallel light is used. The distance between the phase shifter and the profiler (equal to the gap d1 between the phase shifter and the substrate) is set at 110 μm. FIG. 14B is a characteristic view of a one-dimensional beam profile of the diffraction pattern of FIG. 14A. Characteristic line C (thin line) in the figure indicates a one-dimensional beam profile obtained by computer simulation; on the other hand, characteristic line D (thick line) indicates a one-dimensional beam profile measured on the surface of the beam-profiler fluorescent plate. The actual measurement results (characteristic line D) satisfactorily match with theoretical results (characteristic line C) including high-frequency oscillation. In particular, the fact that the minimum strength is nearly zero indicates that excimer laser has a strong self-coherence. The resolving power of the beam profiler 6 is desirably smaller by about one order of magnitude than a crystalline grain diameter. The resolving power obtained in FIGS. 14A and 14B was 0.4 μm. The two-dimensional normalized Fresnel diffraction image formed by in-plane cross-coupled phase shifter is shown in FIGS. 15A and 15B. The gap d is 30 μm. The phase difference was set at 180°. A tetragonal lattice surrounded by the thick line in the figure has a side length of 5 µm. FIG. 15A is a computer simulation image. FIG. 15B is an actual image of laser fluence emerging on the fluorescent plate surface of the beam profiler. Two-dimensional micro pattern (thin line) inside the lattice pattern other than the main lattice pattern (thick line) is captured. It was proved that the profiler effectively used to evaluate the two-dimensional pattern.

FIG. 16A is a characteristic line graph showing a profile formed of multi-beam by a homogenizer. The horizontal axis indicates the distance (µm) from the laser optical acid 50$a$ and the vertical axis indicates the normalized laser intensity index (arbitrary unit). The normalized intensity index of the vertical axis is a parameter or yardstick of crystallization. When these indexes are averaged, a value approximates to 1.0. In FIG. 16A, an intensity index of 1.0 corresponds to a laser fluence of 0.2 J/cm$^2$, which is further multiplied by the coefficient of 0.95, leading to a critical light intensity of 0.19 J/cm$^2$, at which polycrystallization takes place.

In the figure, characteristic line (thin line) E indicates simulation results and the characteristic line F (thick line) indicates actual measurement results. The actual measurement matches with the simulation results very well except for a high spatial frequency composition due to a limited number of beams.

FIG. 16B shows the morphology of a film crystallized under low average light intensity conditions. The sample has a 300 nm-thick SiO$_2$ cap film/200-nm thick a-Si film/1000-nm thick SiO$_2$ film/Si structure crystallized at a substrate temperature of 500° C. A polycrystallized portion (light portion) corresponds to a site exhibiting high intensity. A low intensity site corresponding to a dark portion is a non-crystallized region. The dark portion well matches with the points below the line of 0.19 J/cm$^2$ (intensity index: 0.95) of FIG. 16A. The critical light intensity at which polycrystallization takes place is about 0.19 J/cm$^2$, which is the value obtained when irradiation is uniformly made. Based on the experiment performed by applying light having a high average intensity, it was found that the critical light intensity value at which lateral crystallization is initiated is 0.48 J/cm$^2$, and the critical light intensity value at which film breakdown takes place is 0.90 J/cm$^2$. Furthermore, it was found that the crystal can be grown about 7 micron by a single shot.

In FIG. 17A, the horizontal axis indicates the distance (µm) from the laser optical axis $a$ and the vertical axis indicates the normalized laser intensity index (no unit). The FIG. 17A shows a characteristic line graph showing the relationship between crystallized Si and the laser fluence, thereby showing whether crystallized Si is laterally grown or not, and whether the laterally grown crystallized film is destroyed or not due to excessive contraction force. Characteristic line P in the figure is a critical line of the lateral growth. A Si crystal is laterally grown in the region above line P, whereas it is not laterally grown in the region below the line. Characteristic line Q is a critical line at which the crystallized film is broken. The Si crystalline film is destroyed by excessive contraction in the region above the line, whereas it is not destroyed in the region below the line. The laser fluence conversion values obtained by multiplying the index of the characteristics lines P and Q by the coefficient were about 0.5 J/cm$^2$ and about 0.9 J/cm$^2$, respectively. Characteristic line R, which is in the region sandwiched by both the characteristics lines P and Q, indicates the crystalline film stably and laterally grown without breakdown of the film.

FIG. 17B is an SEM image of a Si thin film during the lateral growth. A laterally grown Si crystal is observed from the optical axis 50$a$ to one side thereof up to 10 µm. However, in the region beyond 10 µm from the optical axis 50$a$, since the intensity of a laser greatly varies, debris of broken film (scattered white-lumps) is observed in the figure. Around the laser optical axis 50$a$, the film remains in an amorphous state since intensity of laser fluence is insufficient, so that no lateral growth is observed.

Figure 18A:
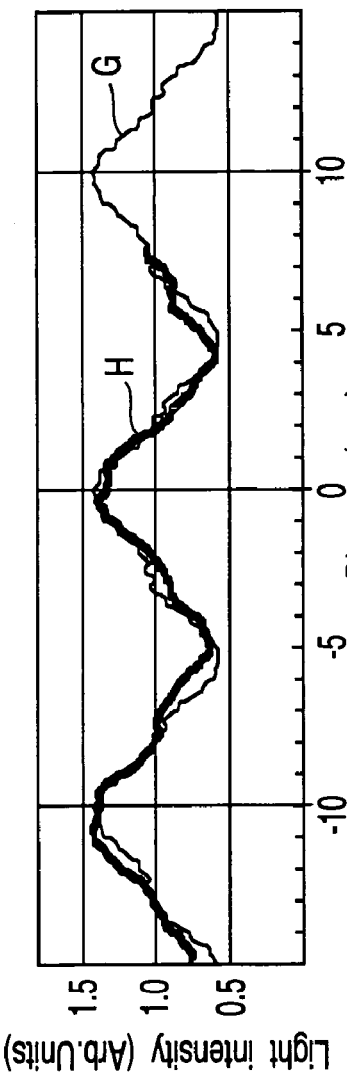
FIG. 18A is a characteristic line showing a beam profile.
Figure 18C:
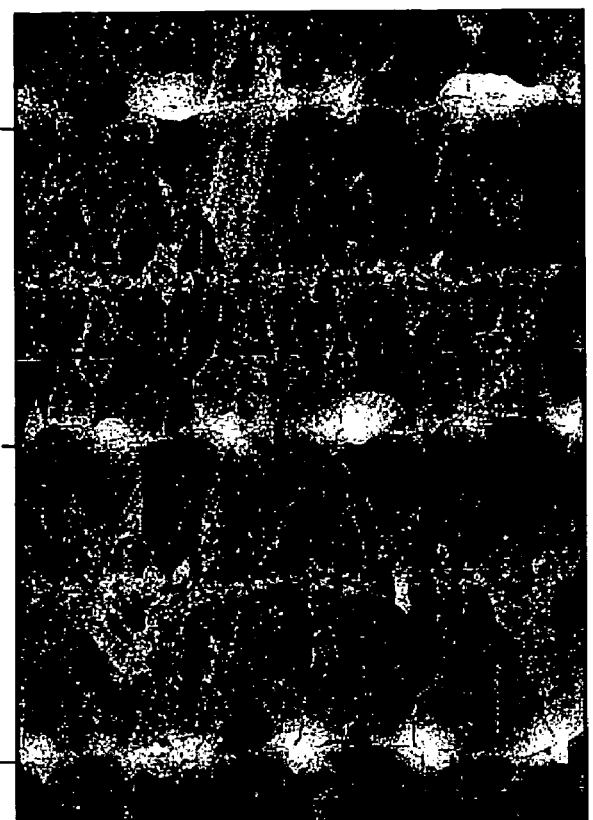
FIG. 18C is a magnified SEM photograph showing a partially magnified the SEM photograph shown in FIG. 18B.
Figure 18B:
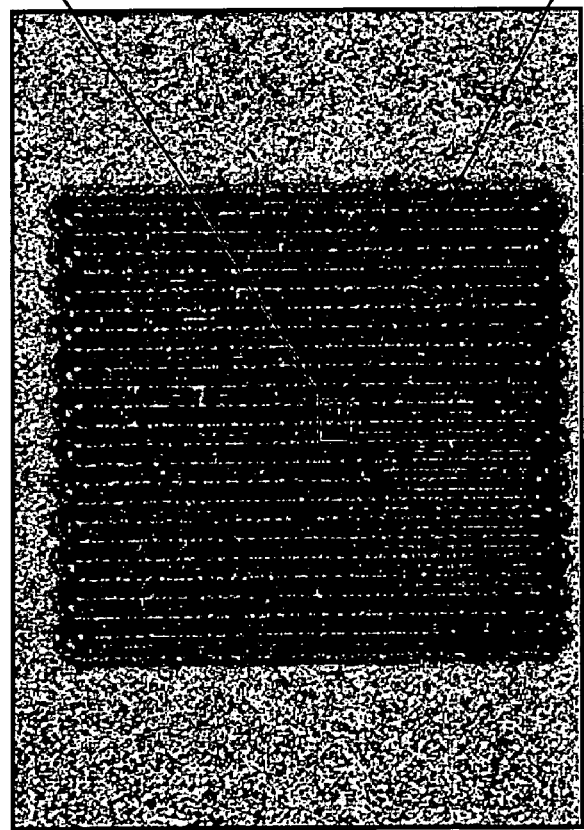
FIG. 18B is an SEM photograph showing a pattern repeat of the laser irradiation region.

Using the aforementioned results, an optical system capable of growing large crystallized grains (average diameter: 5 micron) with a high density was obtained. The light intensity distribution and film morphology obtained in the experiment are shown in FIGS. 18A to 18C. The vertical axis of FIG. 18A indicates the normalized laser intensity (no unit), which is a yardstick parameter of a crystallization state. The average of there parameters approximates to 1.0. Characterization line G of the figure indicates the simulation results, and characterization line H indicates the result of a profile image actually emerging on the fluorescent plate surface of the laser profiler. In FIG. 18A, when the minimum value of the vertical axis, 0.6, is multiplied by an average laser fluence, 0.70 J/cm$^2$, the critical light intensity (at which lateral crystallization is obtained), 0.42 J/cm$^2$ is obtained. On the other hand, when the maximum value 1.3 is multiplied by the coefficient, 0.70 J/cm$^2$, the critical light intensity, 0.91 J/cm$^2$, at which film breakdown takes place, is obtained.

FIG. 18B is an SEM image (0.24 mm×0.24 mm) showing a repeated image pattern in the laser irradiation region (J=0.7 mJ/cm$^2$). FIG. 18C shows a partially enlarged SEM image (20 µm×20 µm) of FIG. 18. From these, it was found that Si crystal grains are grown laterally and stably from the laser optical axis 50$a$ to one side thereof up to 5 µm. As a result, large crystal grains are uniformly formed with a high density over the entire irradiation region (0.24 mm×0.24 mm).

The nature of an excimer laser was analyzed by a high-resolution beam profiler. As a result, the light intensity distribution on the surface of a sample can be designed. Various samples were evaluated for critical light intensity. Based on integral analysis of these results, an optical system capable of growing large crystal grains with a high density (large charging rate) was designed. The efficiency of the optical system thus designed was experimentally confirmed.

The embodiment mentioned above, the annealing apparatus and the annealing method of the present invention are applied to a crystallization apparatus. The present invention may be applied to any steps such as annealing step to be performed after impurities are doped.

EXAMPLE

As an examples of the present invention, TFT-A2 (small size TFT) and TFT-B2 (large size TFT) having the same characteristics but different in size were formed as follows.

First, a substrate was prepared as shown in FIG. 11A. On the surface of an insulating substrate 5 (formed of, for example, corning 1737 glass, molten quartz, sapphire, plastic, or polyimide), a first thin film 302 of 300 nm thick is formed. The first thin film 302 may be a SiO$_2$ film, which is formed by plasma chemical vapor deposition using, for example, tetraethylorthosilicate (TEOS) and O$_2$, SiN/SiO$_2$ laminate film, alumina, or mica. On the surface of the first thin film 302, a second thin film, namely, an amorphous semiconductor film 303 (100 nm thick) is formed of amorphous Si or SiGe by plasma chemical vapor deposition. On the amorphous semiconductor film 303, further a SiO$_2$ film 305 of 100 nm thick is formed as a gate insulating film, by plasma chemical vapor deposition using tetraethylorthosilicate (TEOS) and $O_2$. Thereafter, these thin films are subjected to the dehydrogenation treatment performed by heating under a nitrogen atmosphere at 600° C. for one hour.

As a next step, laser crystallization is performed by using the apparatus shown in FIG. 19. As a laser source 1, a high-energy laser emitting light by pulse oscillation, such as a KrF excimer laser, is used.

The laser light emitted from the laser source 1 passes through an attenuator 2 and a beam profile modulator 3 modulating power and a beam profile, respectively. As a result, the power and the beam profile are modulated. The laser light thus modulated reaches the movable stage 7 having the semiconductor substrate 5 mounted thereon. The laser crystallization is performed by irradiating the semiconductor substrate 5 with the modulated laser light. On the movable stage, a beam profiler 6 for measuring a beam profile and also used as a power meter, is arranged. The beam profiler works in couple with a personal computer 8 to set the height z of the movable stage 7 and optical parameters (angle of the attenuator 2, position of a phase shifter 31, and gap d, etc.) for modulating power and a beam profile, so as to give a preferable beam profile.

The beam profile A shown in FIG. 10A is used for forming small grain crystal region r1 and the beam profile B shown in FIG. 10C is used for forming a large crystal grain region r2. The conditions for beam profiles A and B are set under the system in couple with the personal computer 8.

As a result of crystallization in accordance with beam profile A or beam profile B, poly-Si having crystal grains of a desired size. When crystallization is performed by laser irradiation according to beam profile A, a small crystal grain region r1 is formed in a predetermined region shown in FIG. 10B. On the other hand, when crystallization is performed by laser irradiation according to beam profile B, a large crystal grain region r2 is formed in a predetermined region shown in FIG. 10D. Different crystalline regions can be formed by changing the beam profile of a laser in this manner.

The average number Na of crystal grain boundaries across the current direction in the channel region is evaluated as follows.

To clearly distinguish the edge of the active layer of a TFT, four sites are marked with a laser marker Mb as shown in FIG. 12A. Next, as shown in FIG. 11B, the source electrode 312, drain electrode 313, gate electrode 309, and the interlayer insulating film 314 are removed with an acid such as hydrochloric acid or hydrofluoric acid to expose the poly-Si layer 306 as the active layer (channel region) of the TFT. Subsequently, the channel region 306 is subjected to wet etching for 30 seconds with a Secco etching solution, which is a mixed solution containing $HF:K_2CrO=2:1$. In this way, the grain boundary is clearly differentiated. The etching surface is washed with water, dried, and subjected to observation under scanning electromicrography. As the image observation apparatus, a surface roughness measuring means, or an atomic force microscope may be used.

The number of grain boundaries across the current in the channel region 306 is counted as follows. The source region between two marking sites Mb and the drain region between two marking sites, Mb, each is divided into 10 equal portions to give straight lines in parallel to each other. The number of straight lines crossing the grain boundaries is averaged to obtain the number of grain boundaries.

Since the size of grains is controlled by the beam profile, grain boundaries are present more densely in the small grain size crystal region r1 than in the large grain size crystal region r2.

The gate length La of TFT-A2 is 2 µm and the gate length Lb of TFT-B2 is 4 µm. Each of the widths W is set at 2 µm. To obtain a TFT having the same ability, the beam profiles A and B shown in FIGS. 10A and 10C were previously determined.

Figure 21:
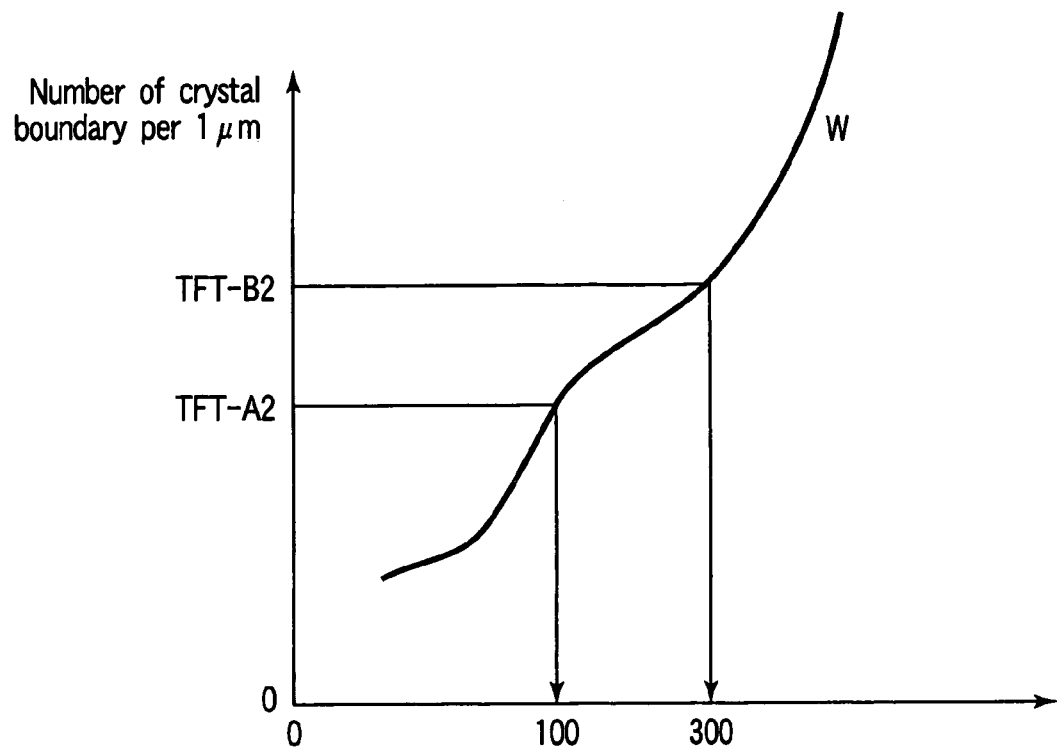
FIG. 21 is a characteristic line graph showing the relationship between gap d1 and the number of grain boundaries (average value Na) per 1 µm.

As shown in FIG. 21, a desired profile was determined by changing the value of gap d1 based on the relationship between the height z of the stage and the number of crystal grain boundaries per 1 µm. In this example, the beam profile required for TFT-A2 was gap d=300 µm and a laser intensity of 0.55 $J/cm^2$. The beam profile required for TFT-B2 was gap d=100 µm and a laser intensity of 0.66 $J/cm^2$.

Under these conditions, a plurality of regions on the substrate were crystallized by applying lasers having beam profile A and B shown in FIGS. 10A and 10C.

The crystallized regions formed by these methods are patterned into sizes suitable for TFT-A1 and TFT-B1 and the following process was performed.

As shown in FIG. 11B, on the gate insulating film, the gate electrode 309 was formed by using, for example, high-phosphorus doped polysilicon, W, TiW, $Wsi_2$, or $MoSi_2$. Ions were implanted with the gate electrode 309 used as a mask to form a source region 311 and the drain region 310. More specifically, in the case of N-type TFT, $P^+$ ions were implanted in an order of $10^{15}$ $cm^{-2}$. In the case of P-type TFT, $BF^{2+}$ ions were implanted in an order of $10^{15}$ $cm^{-2}$. Thereafter, annealing was performed in an electric furnace at 500° C. to 600° C. for about one hour by using nitrogen as a carrier gas to activate impurities. Furthermore, rapid thermal annealing (RTA) was performed at 700° C. for one minute. Finally, after the interlayer insulating film 314 was formed, a contact hole was formed, and then the source and drain regions 312, 313 were formed. As the materials for the source and drain regions 312 and 313, Al, W or Al/TiN may be used.

In evaluating the obtained TFTs, five points of the substrate (350 mm×400 mm) were chosen. More specifically, four corner points and the intersectional point of two diagonal lines were evaluated.

In the region, transistors (TFT-A2) of 2 µm width (d) and 2 µm length (La) and transistors (TFT-B2) of 2 µm width (d) and 4 µm length (Lb) were formed with a predetermined pattern. TFT characteristics were measured at each of the 5 points. The same characteristics were obtained in both TFT-A2 and TFT-B2.

Furthermore, the ratio of Na/L, where Na is the average number of crystal grain boundaries across the current direction in the channel region 306, and L is the gate length, was determined as follows. To distinguish the poly-Si layer of the TFT whose characteristics have been determined, Mb marking and the upper layer structure were removed. The field of view of 50 µm×50 µm was evaluated by a scanning electromicroscope. As a result, the ratio of Na/L, where Na is the average number of crystal grain boundaries across the current direction in the channel region 306 and L is the gate length, in each of TFT-A2 and TFT-B2, was within ±5% of frequency distribution (or standard deviation).

When characteristics of TFTs formed in the present invention were evaluated, TFT-A1 and TFT-B1 had the same performance (electron mobility: 250 $cm^2$ V/sec.), even though they were different in size.

As shown in Table 1, when the substrate temperature is room temperature, Si grains stably and laterally grow at a laser fluence ranging from 0.6 to 1.3 ($J/cm^2$). When the substrate temperature is 300° C., Si grains stably and laterally grow at a laser fluence ranging from 0.5 to 1.2 ($J/cm^2$).

When the substrate temperature is 500° C., Si grains stably and laterally grow at a laser fluence ranging from 0.4 to 1.1 (J/cm²).

If these results are integrated, it was found that the laser fluence must be limited within the range of 0.6 to 0.9 (J/cm²) in order to obtain the Si crystalline film grown stably and laterally. In other words, the peak and bottom of the light intensity modulated is limited.

TABLE 1

| Threshold (J/cm²) | Substrate temperature 500° C. |
| --- | --- |
| Crystallization | 0.1 to 0.2 |
| Lateral growth | 0.5 to 0.4 |
| Film breakdown | 1.1 to 0.9 |

According to the present invention, it is possible to form different crystalline regions having predetermined grain sizes in the same substrate, for various TFTs different in size having a given performance.

According to the present invention, since a Si crystalline film is grown laterally and stably without breaking the film, a TFT operated at a high-speed and having a constant threshold (variance in threshold is low) can be provided.

According to the present invention may be applied not only to an excimer laser crystalline method for crystallizing a thin film texture of an amorphous semiconductor and an amorphous single crystalline semiconductor but also to a laser annealing method for activating impurities doped in a semiconductor layer.

what is claimed is:

1. An annealing method comprising the steps of:
   setting target values with respect to intensity of laser light and distribution of the intensity in advance;
   preparing a beam profile modulating section between a laser source and an irradiation region and preparing a substrate and a beam profile measuring section so as to be interchangeably placed into the irradiation region;
   placing the beam profile measuring section in the irradiation region, emitting laser light from the light source, modulating the intensity of the laser light and distribution of the intensity by the beam profile modulating section, and measuring the intensity of the laser light incident on the irradiation region and the distribution of the intensity by the beam profile measuring section;
   adjusting parameters of the beam profile modulating section based on the measuring results such that the measuring results match with the target values;
   placing the substrate in the irradiation region such that an incident surface of the substrate is positioned in the irradiation region, thereby aligning the substrate with the beam profile modulating section;
   irradiating the substrate with the laser light modulated by the beam profile modulating section when the measurement results match with the targets; and
   repeating the alignment step and the laser irradiation step to form a semiconductor substrate having not smaller than two types of crystal grains different in diameter therein.

2. An annealing method comprising:
   setting and storing a target beam profile in a memory apparatus, recalling the target beam profile from the memory apparatus, setting an annealing beam profile with reference to the target beam profile thus recalled, and irradiating a non single crystalline semiconductor layer with laser light.

3. The annealing method according to claim 2, wherein a beam profile of a most preferable laser light experimentally obtained is used as the target beam profile to be stored and recalled from the memory apparatus.

4. The annealing method according to claim 2, wherein the target beam profile is a beam profile used in an annealing step and stored in the memory apparatus and recalled from the memory apparatus in a next annealing step.

5. The annealing method according to claim 2, wherein the target beam profile recalled from the memory apparatus and the beam profile of the laser light during an annealing step are displayed on a display screen.

6. A method of annealing a non single crystalline semiconductor thin film comprising the steps of:
   (a) inserting a spatial intensity modulating optical element between a laser source and a beam profile measuring section;
   controlling a gap between an incident surface of the beam profile measuring section and the spatial intensity modulating optical element to be 500 μm or less;
   measuring intensity of laser light modulated by the spatial intensity modulating optical element and applied to the incident surface of the beam profile measuring section, distribution of the intensity and the gap, individually;
   (b) inserting the spatial intensity modulating optical element between a substrate having the non single crystalline semiconductor thin film and the laser source, controlling the gap between an incident surface of the substrate and the spatial intensity modulating optical element to be 500 μm or less, irradiating the incident surface of the substrate with laser light modulated by the spatial intensity modulating optical element, and measuring the intensity of laser light, distribution of the intensity and the gap when it is confirmed that lateral crystallization of the semiconductor thin film proceeds by irradiation of the modulated laser light;
   (c) setting the measurement results in step (a) corresponding to those in step (b) as target values of the intensity of laser light, distribution of the intensity, and the gap;
   (d) controlling intensity of laser light, distribution of the intensity and the gap so as to match with the target values and irradiating the incident surface of the substrate with the laser light modulated by the spatial intensity modulating optical element under the control conditions; and
   (e) forming a semiconductor layer having not smaller than two types of crystal grains different in average diameter in the same substrate by repeating the steps (b) to (d).

7. The method according to claim 6, wherein the target values of step (c) are stored and steps (d) to (e) are performed based on the target values by recalling the target values every time the substrate is irradiated with laser light.

8. The method according to claim 6, wherein the intensity of laser light, distribution of the intensity, and the gap of step (b) are set such that the semiconductor thin film is crystallized, and laterally and stably grown without destroying the grown film.

9. The method according to claim 6, wherein, in step (b), temperature of the substrate is measured, the relationship between the substrate temperature, the intensity of the laser light, and the lateral growth is captured, and the substrate is heated in step (d) based on the relationship.

10. The method according to claim 6, wherein, in step (a), a fluorescent plate is provided on the incident surface of the beam profile measuring section and measurement is performed by placing the fluorescent plate at the same level as the incident surface of the substrate.

11. The method according to claim 6, wherein, in steps (a), (b) and (d), a phase shifter having a step portion for diffracting laser light is used as the spatial intensity modulating optical element and the phase shifter is designed such that a laser optical axis passes through the step portion.

12. An annealing method, comprising:
setting target values with respect to an intensity of laser light and distribution of the intensity in advance;
placing a beam profile measuring section in an irradiation region, emitting laser light from a light source, modulating the intensity of the laser light and distribution of the intensity by a beam profile modulating section, and measuring the intensity of the laser light incident on the irradiation region and the distribution of the intensity by the beam profile measuring section;
adjusting parameters of the beam profile modulating section based on measuring results such that the measuring results match with the target values, and
matching the measurement results with the targets, and irradiating a substrate with the laser light modulated by the beam profile modulating section.

* * * * *